(12) United States Patent
Migita

(10) Patent No.: US 11,398,376 B2
(45) Date of Patent: Jul. 26, 2022

(54) MANUFACTURING METHOD OF A SEMICONDUCTOR DEVICE INCLUDING A SUPPORT

(71) Applicant: Kioxia Corporation, Tokyo (JP)

(72) Inventor: Tatsuo Migita, Nagoya (JP)

(73) Assignee: Kioxia Corporation, Tokyo (JP)

( * ) Notice: Subject to any disclaimer, the term of this patent is extended or adjusted under 35 U.S.C. 154(b) by 47 days.

(21) Appl. No.: 17/012,337

(22) Filed: Sep. 4, 2020

(65) Prior Publication Data

US 2021/0280416 A1 Sep. 9, 2021

(30) Foreign Application Priority Data

Mar. 3, 2020 (JP) .............................. JP2020-036095

(51) Int. Cl.
*H01L 21/02* (2006.01)
*H01L 23/13* (2006.01)
*C23C 14/06* (2006.01)

(52) U.S. Cl.
CPC .... *H01L 21/02527* (2013.01); *C23C 14/0605* (2013.01); *H01L 21/022* (2013.01); *H01L 21/02664* (2013.01); *H01L 23/13* (2013.01)

(58) Field of Classification Search
CPC ............. H01L 21/02527; H01L 21/022; H01L 21/02664; H01L 23/13
USPC .......................................... 257/613; 438/458
See application file for complete search history.

(56) References Cited

U.S. PATENT DOCUMENTS

| 2009/0291319 | A1 | 11/2009 | Nagatani et al. |
| 2015/0228728 | A1 | 8/2015 | Dimitrakopoulos et al. |
| 2016/0104640 | A1* | 4/2016 | Ruhl ................. H01L 21/02488 438/653 |
| 2019/0013212 | A1 | 1/2019 | Matsuura |

FOREIGN PATENT DOCUMENTS

| JP | 2005-260058 A | 9/2005 |
| JP | 4726855 B2 | 7/2011 |
| JP | 4754402 B2 | 8/2011 |
| JP | 2017-114070 A | 6/2017 |
| JP | 6203988 B1 | 9/2017 |
| JP | 2018-29184 A | 2/2018 |
| JP | 2018-173542 A | 11/2018 |
| WO | WO 2017/149810 A1 | 9/2017 |

* cited by examiner

*Primary Examiner* — Quoc D Hoang
(74) *Attorney, Agent, or Firm* — Oblon, McClelland, Maier & Neustadt, L.L.P.

(57) ABSTRACT

A manufacturing method of an embodiment of a semiconductor device, the manufacturing method includes: heating a second layer of a first member including a first layer, the second layer, and a third layer, in which the first layer includes a support layer, the second layer includes a compound containing carbon and at least one element selected from the group consisting of silicon and metals, the third layer includes a semiconductor layer and/or a wiring layer, and the second layer is located between the first layer and the third layer, and obtaining a second member in which a carbonaceous material layer is formed on a surface of the second layer and/or a carbonaceous material region is formed inside the second layer; and cleaving the second member from the carbonaceous material layer or the carbonaceous material region, and obtaining a third member including the third layer.

20 Claims, 25 Drawing Sheets

HEAT

131

132

MANUFACTURING METHOD OF A SEMICONDUCTOR DEVICE INCLUDING A SUPPORT

CROSS-REFERENCE TO RELATED APPLICATION

This application is based upon and claims the benefit of priority from Japanese Patent Application No. 2020-036095, filed on Mar. 3, 2020, the entire contents of which are incorporated herein by reference.

FIELD

Embodiments described herein relate generally to a manufacturing method and support of a semiconductor device.

BACKGROUND

There has been known a method for manufacturing a semiconductor device in such a manner that a semiconductor device such as a wafer and a substrate, which is temporarily pasted onto a support including a support layer and a peeling layer provided on the support layer, is peeled from the support after being processed. At this time, the peeling layer is present between the support layer and the semiconductor device, and a carbon material such as resin and graphite is used for the peeling layer, and the semiconductor device can be peeled thermally or mechanically. However, since the peeling layer is thermally unstable such as being cured and shrunk at a high temperature and has low solvent resistance, the support itself may not be stable if the peeling layer is present when the semiconductor device is manufactured.

DETAILED DESCRIPTION

Figure 1:
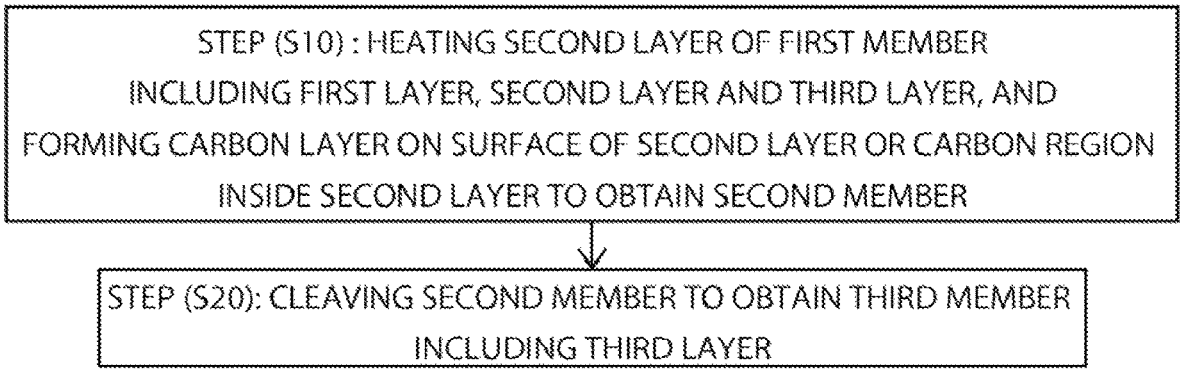
FIG. 1 is a flowchart of a manufacturing method of a semiconductor device according to an embodiment.

A manufacturing method of an embodiment of a semiconductor device, the manufacturing method includes: heating a second layer of a first member including a first layer, the second layer, and a third layer, in which the first layer includes a support layer, the second layer includes a compound containing carbon and at least one element selected from the group consisting of silicon and metals, the third layer includes a semiconductor layer and/or a wiring layer, and the second layer is located between the first layer and the third layer, and obtaining a second member in which a carbonaceous material layer is formed on a surface of the second layer and/or a carbonaceous material region is formed inside the second layer; and cleaving the second member from the carbonaceous material layer or the carbonaceous material region, and obtaining a third member including the third layer.

Hereinafter, embodiments will be described with reference to the drawings.

In this specification, some elements are given examples of a plurality of expressions. The examples of these expressions are merely examples, and do not deny that the above elements are expressed by other expressions. Moreover, elements to each of which a plurality of expressions are not attached may be expressed by other expressions.

Further, the drawings are schematic, and relationships between thicknesses and planar dimensions, thickness ratios of respective layers, and the like may differ from actual ones. Moreover, the drawings may have different dimensional relationships and ratios therebetween. Further, some reference symbols are omitted in the drawings.

First Embodiment

A first embodiment relates to a manufacturing method of a semiconductor device. FIG. 1 illustrates a flowchart of the manufacturing method of a semiconductor device. The manufacturing method of a semiconductor device, which is illustrated in the flowchart of FIG. 1, includes: a step (S10) of heating a second layer of a first member including a first layer, the second layer, and a third layer, in which the first layer includes a support layer, the second layer includes a compound containing carbon and at least one element selected from the group consisting of silicon and metals, the third layer includes a semiconductor layer and/or a wiring layer, and the second layer is located between the first layer and the third layer, and obtaining a second member in which a carbonaceous material layer is formed on a surface of the second layer and/or a carbonaceous material region is formed inside the second layer; and a step (S20) of cleaving the second member from the carbonaceous material layer or the carbonaceous material region, and obtaining a third member including the third layer. A semiconductor device manufactured by the manufacturing method of the embodiment is, for example, a nonvolatile memory chip such as a NAND flash memory chip or a semiconductor package having a nonvolatile memory chip mounted therein.

Figure 2:
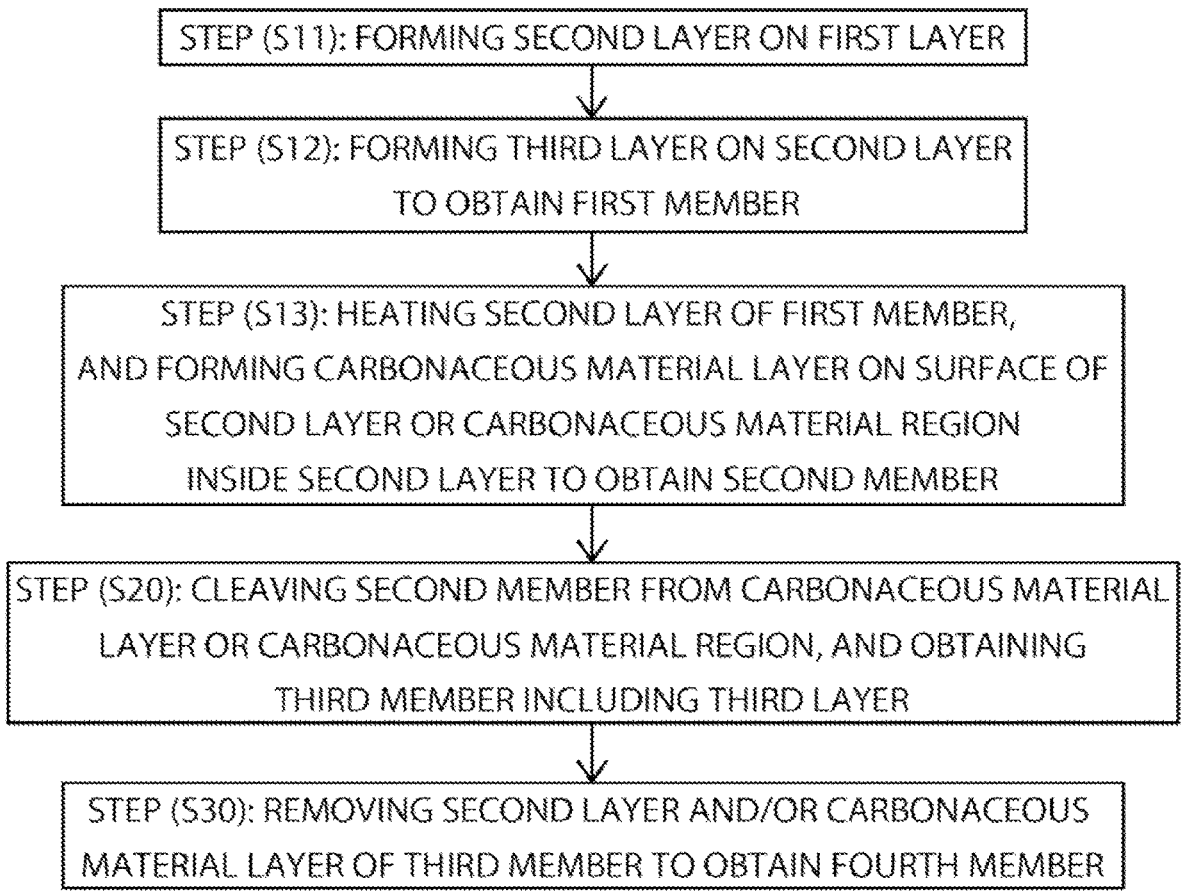
FIG. 2 is a flowchart of the manufacturing method of a semiconductor device according to the embodiment.

FIG. 2 illustrates a more specific flowchart of the manufacturing method of a semiconductor device. The manufacturing method of a semiconductor device, which is illustrated in the flowchart of FIG. 2, includes: a step (S11) of forming a second layer on a first layer; a step (S12) of forming a third layer on the second layer to obtain a first member; a step (S13) of heating the second layer of the first member, forming a carbon layer on a surface of the second layer or forming a carbon region inside the second layer, and obtaining a second member; a step (S20) of cleaving the second member from a carbonaceous material layer or a carbonaceous material region, and obtaining a third member including a third layer; and a step (S30) of removing the second layer of the third member and/or the carbonaceous material layer to obtain a fourth member. In the step (S10) illustrated in the flowchart of FIG. 1, which is of heating a second layer of a first member including a first layer, the second layer, and a third layer, in which the first layer includes a support layer, the second layer includes a compound containing carbon and at least one element selected from the group consisting of silicon and metals, the third layer includes a semiconductor layer and/or a wiring layer, and the second layer is located between the first layer and the third layer, and obtaining a second member in which a carbonaceous material layer is formed on a surface of the second layer and/or a carbonaceous material region is formed inside the second layer, there are included: the step (S11) illustrated in the flowchart of FIG. 2, which is of forming a second layer on a first layer; the step (S12) illustrated in the flowchart of FIG. 2, which is of forming a third layer on the second layer to obtain a first member; and the step (S13) illustrated in the flowchart of FIG. 2, which is of heating the second layer of the first member, forming a carbonaceous material layer on a surface of the second layer or forming a carbonaceous material region inside the second layer to obtain a second member.

Figure 3:
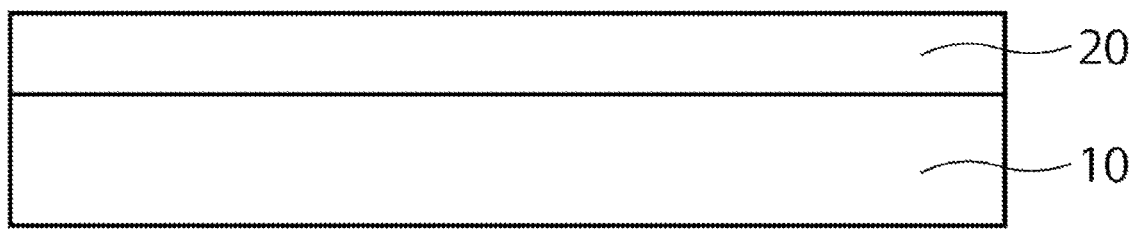
FIG. 3 is a conceptual diagram of a support according to the embodiment.

FIG. 3 illustrates a support 100 in which a first layer 10 and a second layer 20 are laminated on each other. The support 100 includes a first layer 10 including a support layer, and a second layer 20 including a compound containing carbon and at least one element selected from the group consisting of silicon and metals. The manufacturing method of a semiconductor device according to the embodiment is a method for forming a third layer, which includes a semiconductor layer and a semiconductor element, on the support 100 in which the first layer 10 and the second layer 20 are laminated on each other. The support 100 is obtained by the step (S11) of forming the second layer 20 on the first layer 10.

The first layer 10 includes at least a support layer. The support layer is preferably a substrate that is flat and has heat resistance and solvent resistance. As the support layer, any of a glass substrate, a metal substrate, and a Si substrate is preferable. In the first layer 10, between the support layer and the second layer 20, an underlayer or an adhesion layer, which serves as a base of the second layer 20, may be provided. A material that is not molten or deformed at high temperature treatment is preferable no matter what the support layer is. As the glass substrate, it is preferable to use a substrate of high melting point glass such as quartz glass.

The second layer 20 is a layer including a compound that forms a carbonaceous material layer or a carbonaceous material region by being heated. The second layer 20 preferably includes a compound containing carbon and at least one element selected from the group consisting of silicon and metals, which form a carbonaceous material by heat treatment at high temperature. More specifically, the compound of the second layer 20 is preferably an inorganic compound containing carbon and at least one element selected from the group consisting of silicon and metals, which form a carbonaceous material. The second layer 20 contains carbon serving as a carbon source of the carbonaceous material and compounded Si and/or metal for stabilizing the carbon, and is thermally and chemically stable. The metal of the compound of the second layer 20 is preferably at least one selected from the group consisting of W, Ta, Cu, Ti, V, Cr, Nb, Mo, Zr, Hf, Co, Sc, Mn, Fe and Ni. From a viewpoint of forming the carbonaceous material, the compound of the second layer 20 is preferably at least one compound selected from the group consisting of metal and/or Si carbide, carbonitride, carbonate and carbon oxynitride. When the compound of the second layer 20 is two or more types of compounds, the compound of the second layer 20 is preferably a solid solution including two or more types of compounds selected from the group consisting of a metal and/or Si carbide, a metal and/or Si carbonitride, a carbon oxide and a carbon oxynitride. Moreover, from a viewpoint of forming a carbonaceous material easily peeled off after being heated, as the compound of the second layer 20, at least one compound selected from the group consisting of SiC, SiCN, SiCO, SiCON, WC, TaC, CuC, TiC, VC, CrC, NbC, MoC, ZrC, HfC, CoC, ScC and MnC is preferable.

When a concentration of the compound containing carbon and at least one element selected from the group consisting of silicon and metals in the second layer 20 before the heat treatment for forming the carbonaceous material is low, the carbonaceous material is less likely to be formed. Accordingly, the compound containing carbon and at least one element selected from the group consisting of silicon and metals is contained preferably by 90 wt % or more and 100 wt % or less in the second layer 20, more preferably by 95 wt % or more in the second layer 20, still more preferably by 98 wt % or more and 100 wt % or less in the second layer 20. From the same viewpoint, a total concentration of the carbonaceous material, resin and polymer in the second layer 20 before the heat treatment for forming the carbonaceous material is preferably 0 wt % or more and 10 wt % or less, more preferably 0 wt % or more and 5 wt % or less, still more preferably 0 wt % or more and 1 wt % or less. The second layer 20 preferably satisfies the above concentration of the carbonaceous material, the resin and the polymer even after the third layer (including the semiconductor layer and the like) is formed.

The second layer 20 is substantially free of the carbonaceous material, the resin and the polymer during and after the formation of the third layer (including the semiconductor layer and the like). When a layer of the carbonaceous material, the resin and the polymer, which serves as a peeling layer, is used instead of the second layer 20, the peeling layer may be so unstable as to be peeled off or easily peeled off depending on the heat treatment for forming the third layer and on a solvent for use. However, in the embodiment, since a carbonaceous material layer 21 and/or a carbonaceous material region 22, which serves as the peeling layer, is formed from the second layer 20 after the formation of the third layer, it is possible to form the third layer on a stable member, and to perform stable peeling from the second layer 20 or a selective position in the vicinity thereof.

The second layer 20 is preferably formed directly on a surface of the first layer 10 so that a surface of the second layer 20, which faces the first layer 10, is in direct contact with the first layer 10. The second layer 20 is formed on the first layer 10 by a PVD method, a CVD method, an ALD method, an MOCVD method, a coating method, a printing method, a film laminating process, or the like. Examples of the PVD method include a sputtering method using an inorganic compound, such as SiC, which is a film-forming target, as a target. Examples of the CVD method include a method of forming a film by a chemical reaction by plasma or heat with a mixed gas of a hydrocarbon gas and a gas such as $SiH_4$ (or $Si_3N_4$). The printing method includes an inkjet method.

Since the carbonaceous material layer 21 and the carbonaceous material region 22, which are to be formed, are easily peeled off even if being thin, the carbonaceous material layer 21, the carbon of the second layer 20, which is a carbon supply source to the carbonaceous material region, and the compound containing at least one element selected from the group consisting of Si and/or metal are partially molten to precipitate carbon, whereby the carbonaceous material layer 21 and/or the carbonaceous material region 22, which is sufficient, can be formed. Therefore, a thickness of the second layer 20 is preferably 1 nm or more, more preferably 5 nm or more. The thickness of the second layer 20 is preferably 500 nm or less, and more preferably 100 nm or less from a viewpoint that film formation cost increases when the thickness of the second layer 20 is too thick.

Next, the manufacturing method of a semiconductor device according to the first embodiment will be described more specifically with reference to process conceptual diagrams of the manufacturing method of a semiconductor device in FIGS. 5 to 8.

Figure 4:
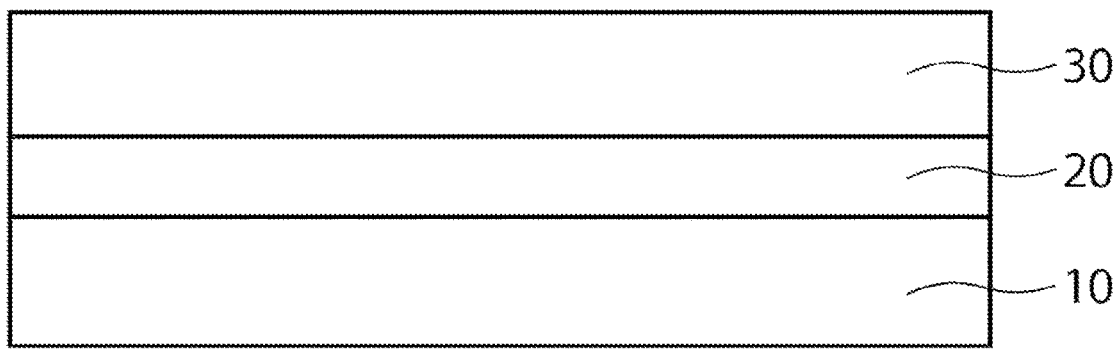
FIG. 4 is a process conceptual diagram of the manufacturing method of a semiconductor device according to the embodiment.

First, there is performed the step (S12) of forming the third layer 30 on the surface of the second layer 20 of the support 100 illustrated in the conceptual diagram of FIG. 3 to obtain the first member 200 illustrated in the process conceptual diagram of FIG. 4.

The third layer 30 includes a wiring layer and/or a semiconductor layer. In the third layer 30, in addition to the wiring layer and the semiconductor layer, a heat dissipation layer having high thermal conductivity may be provided so that heat hardly diffuses toward the wiring layer and the semiconductor layer when the second layer 20 is heated, and there may be provided a protective layer that protects the wiring layer and the semiconductor layer at the time of removing the second layer 20 and the carbonaceous material layer, and the like. In this case, the heat dissipation layer, the protective layer and the like are provided closer to the second layer 20 than the wiring layer and/or the semiconductor layer is. In addition to the wiring layer and/or the semiconductor layer, the third layer 30 may include those included in a semiconductor device, those including a package of a substrate, a wafer, a semiconductor chip, a sealing material, and the like.

A temperature of the heat treatment in the step of forming the third layer 30 is affected by ease of forming the carbonaceous material in the second layer 20, but in the embodiment, a treatment at a temperature of 300° C. or higher and 950° C. or lower can be included. From the same viewpoint, in the step (S12) of forming the third layer 30, a treatment at 400° C. or higher and 900° C. or lower can be included. When such a member that forms the third layer 30 includes the peeling layer, the peeling layer is in a peeled state when the treatment is performed in the temperature range, which makes it difficult to form the third layer 30. It is preferable to provide the heat dissipation layer because the inclusion of the heat dissipation layer makes it difficult for the heat during the formation of the third layer 30 to be transmitted to the second layer 20.

Figure 5:
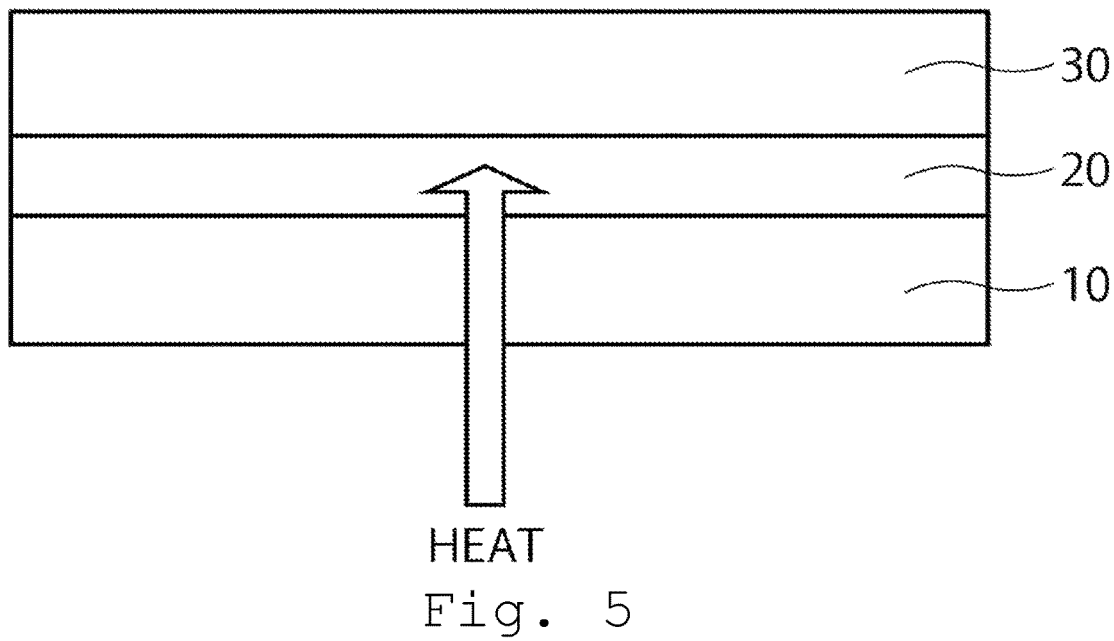
FIG. 5 is a process conceptual diagram of the manufacturing method of a semiconductor device according to the embodiment.
Figure 6:
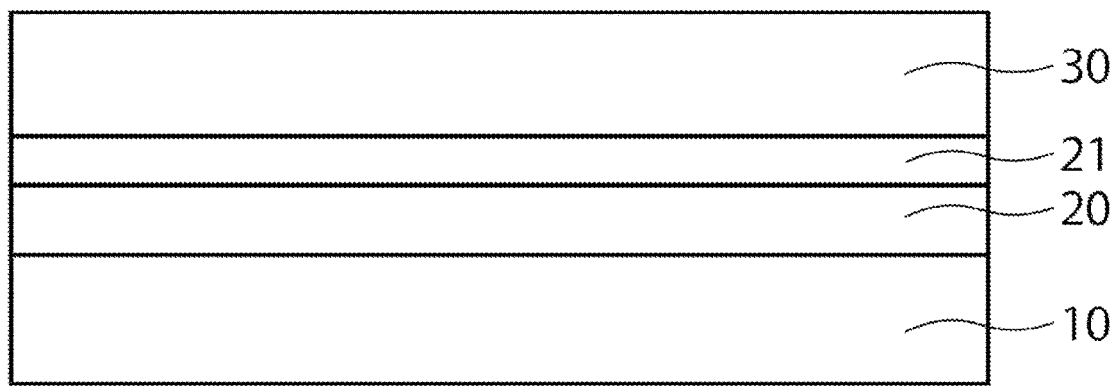
FIG. 6 is a process conceptual diagram of the manufacturing method of a semiconductor device according to the embodiment.

Next, there is performed the step (S13) of heating the second layer 20 of the first member 200 as illustrated in the process conceptual diagram of FIG. 5, and forming the carbonaceous material layer 21 on a surface of the second layer 20 to obtain a second member 300 illustrated in the process conceptual diagram of FIG. 6. Examples of a heating tool of the second layer 20 include a lamp, a heater, and a laser. The second layer 20 is preferably heated by a pulse laser. Since the second layer 20 can be locally heated in a short time, it is preferable to heat the second layer 20 from the first layer 10 as illustrated by an arrow in the process conceptual diagram of FIG. 5. This way of heating is suitable for forming a layered carbonaceous material. A formation position of the carbonaceous material layer 21 can be controlled by changing a wavelength of the laser. In the step (S13) of obtaining the second member 300 in FIG. 6, the wavelength of the laser is adjusted so that the carbonaceous material layer 21 is selectively formed in a portion of the second layer 20, which is close to the third layer 30.

When the second layer 20 is treated at a high temperature, a carbonaceous material is formed from the compound of the second layer 20, which contains carbon and at least one element selected from the group consisting of Si and/or metal. Accordingly, a heating temperature of the second layer 20 in the step (S13) of obtaining the second member 300 is preferably 1000° C. or higher. When the heating temperature is too high, the first layer 10 or the like may be deformed, so that the heating temperature of the second layer 20 is preferably equal to or lower than a melting point of the support layer for use in the first layer 10, for example, preferably 1500° C. or lower. Moreover, after being heated, the second member 300 is cooled to 200° C. or lower.

The carbonaceous material layer 21 preferably contains graphene and/or graphite, which is easily peeled off, and may also contain a carbonaceous material such as amorphous carbon. Considering peelability, 50 wt % or more of the carbonaceous material layer 21 is preferably graphene and/or graphite. 50 wt % or more and 100 wt % or less of the carbonaceous material layer 21 is preferably graphene and/or graphite. A thickness of the carbonaceous material layer 21 is preferably 0.1 nm or more and 100 nm or less because the peelability is sufficient even if the carbonaceous material layer 21 is thin. The carbonaceous material layer 21 may be a layered product having a flat main surface without unevenness or a layered product having an uneven main surface. Herein, the main surface is a surface facing the third layer 30.

Figure 7:
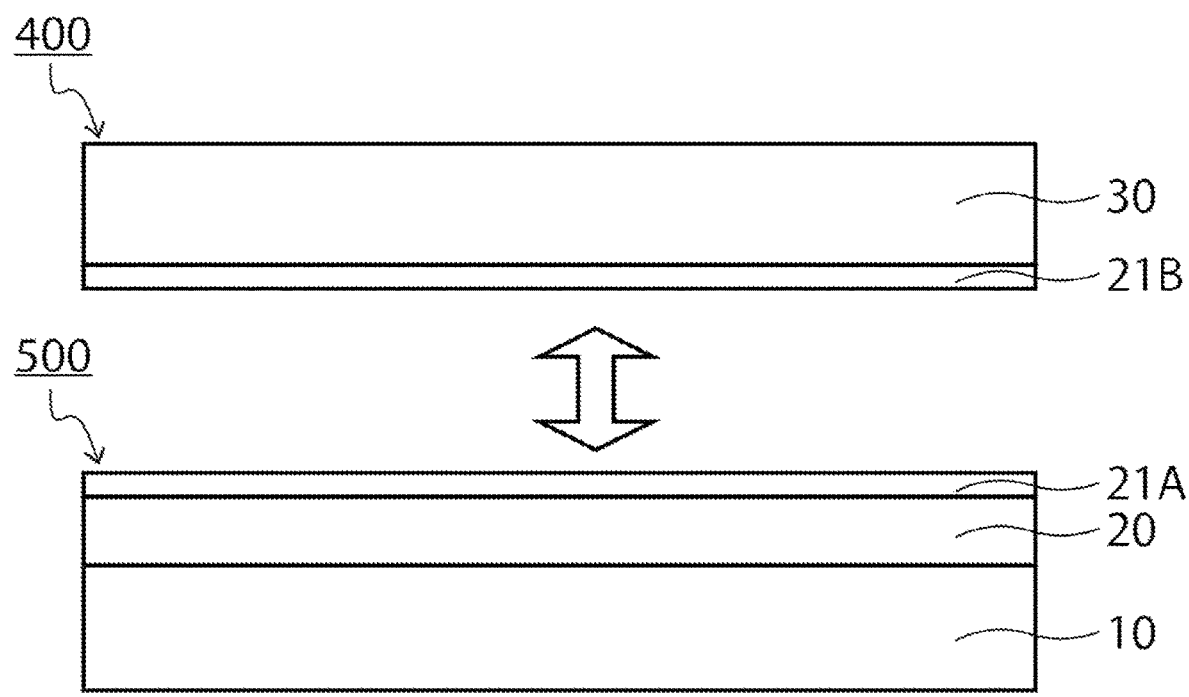
FIG. 7 is a process conceptual diagram of the manufacturing method of a semiconductor device according to the embodiment.

Next, as illustrated in the process conceptual diagram of FIG. 7, there is performed the step (S20) of cleaving the second member 300 from the carbonaceous material layer 21 to obtain the third member 400 including the third layer 30. The third member 400 includes a carbonaceous material layer 21A cleaved from the third layer 30 and attached to the third layer 30. Moreover, a member 500 including the first layer 10 and the second layer 20 is also obtained by the cleavage, and the member 500 includes a carbonaceous material layer 21B attached to the second layer 20. In the cleavage, preferably, the carbonaceous material layer 21 is cleaved by applying a mechanical force so as to separate the first layer 10 and the third layer 30 from each other.

Figure 8:
FIG. 8 is a process conceptual diagram of the manufacturing method of a semiconductor device according to the embodiment.

Next, there is performed the step (S30) of removing the carbonaceous material layer 21 of the third member 400 illustrated in the process conceptual diagram of FIG. 7 to obtain a fourth member 600 illustrated in the process conceptual diagram of FIG. 8. The carbonaceous material layer 21 is removed, the support 100 is separated from such a member manufactured on the support 100, and the fourth member 600 that is a semiconductor device is obtained.

The carbonaceous material layer 21 can be removed by, for example, performing plasma treatment. When a carbonaceous material of the carbonaceous material layer 21A is not attached to the third member 400 at the time of cleavage, this step can be omitted. Moreover, when an intermediate layer is used as the third layer 30, the intermediate layer can be removed by performing plasma treatment in a similar manner.

Further, for example, in the step (S13) of obtaining the second member, an irradiation position of the pulse laser is set close to the first layer 10, whereby the carbonaceous material layer 21 can be formed between the first layer 10 and the second layer 20. This method will be described with reference to process conceptual diagrams of FIGS. 9 and 10.

Figure 9:
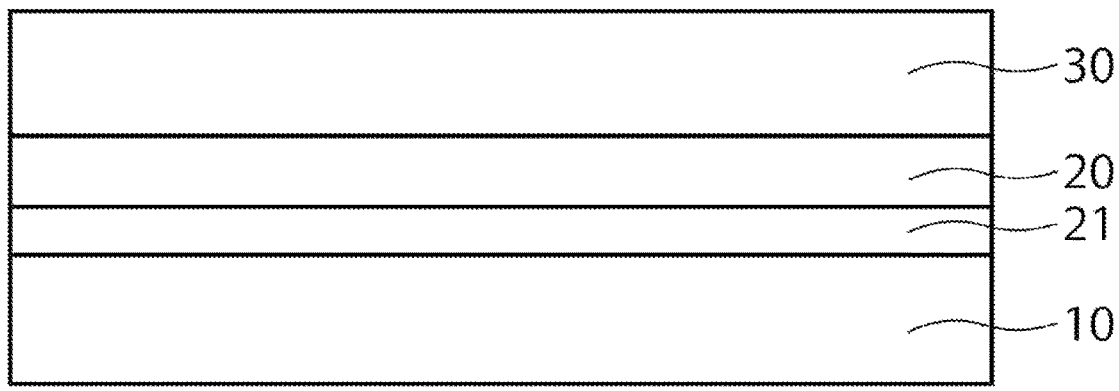
FIG. 9 is a process conceptual diagram of the manufacturing method of a semiconductor device according to the embodiment.
Figure 10:
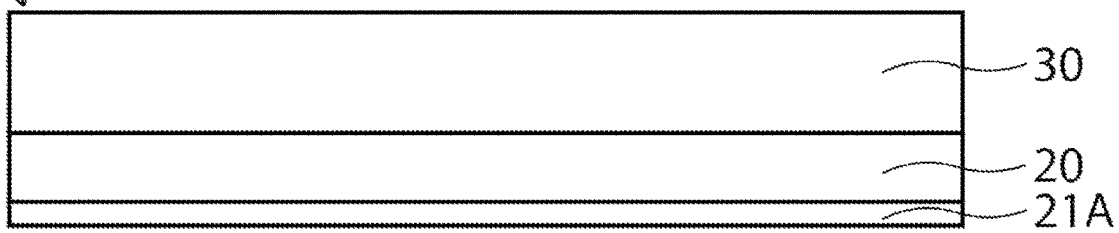
FIG. 10 is a process conceptual diagram of the manufacturing method of a semiconductor device according to the embodiment.
Figure 10:
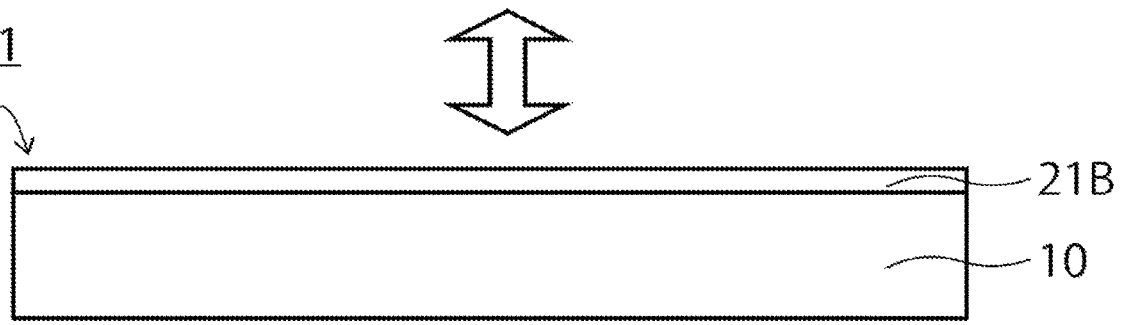

A portion of the second layer 20 of the first member 200, which is close to the first layer 10, is selectively heated, and a second member 301 is obtained, which has the carbonaceous material layer 21 on the first layer 10 as illustrated in the process conceptual diagram of FIG. 9. Then, the carbonaceous material layer 21 is cleaved in a similar manner, whereby a third member 401 is obtained, which includes the second layer 20 and the third layer 30 as illustrated in the process conceptual diagram of FIG. 10. The third member 401 includes the carbonaceous material layer 21A attached to the second layer 20. Further, a member 501 including the first layer 10 is obtained by the cleavage, and the carbonaceous material layer 21B is attached to the first layer 10.

The second layer 20 and carbonaceous material layer 21A of the third member 401 are removed, and further, the intermediate layer of the third layer 30 thereof is removed according to needs, whereby the fourth member can be obtained.

Moreover, for example, in the step (S13) of obtaining the second member, the irradiation position of the pulse laser is set to the central portion of the second layer 20 in a thickness direction, whereby the carbonaceous material region 22 can be formed in the second layer 20. This method will be described with reference to the process conceptual diagrams of FIGS. 11 and 12.

Figure 11:
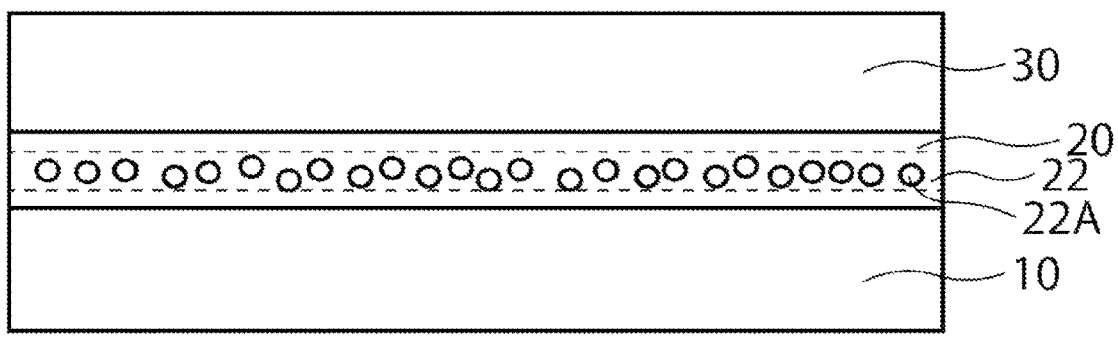
FIG. 11 is a process conceptual diagram of the manufacturing method of a semiconductor device according to the embodiment.
Figure 12:
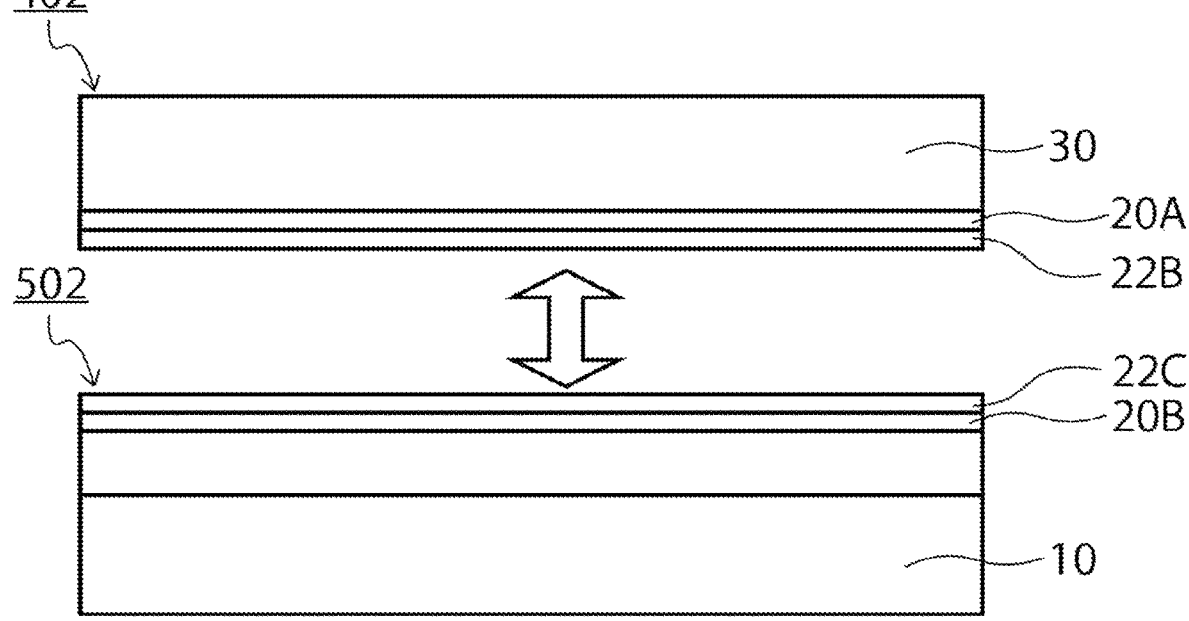
FIG. 12 is a process conceptual diagram of the manufacturing method of a semiconductor device according to the embodiment.

The central portion of the second layer 20 of the first member 200 in the thickness direction is selectively heated, whereby a carbonaceous material 22A indicated by white circles is formed in the vicinity of the central portion of the second layer 20 in the thickness direction as illustrated in the process conceptual diagram of FIG. 11, and a second member 302 is obtained, in which a portion having the carbonaceous material 22A present therein and surrounded by broken lines is defined as the carbonaceous material region 22. Then, the second member 302 is cleaved from the carbonaceous material region 22 in a similar manner, whereby a third member 402 is obtained, which includes a second layer 20A and the third layer 30 as illustrated in the process conceptual diagram of FIG. 12. The second layer 20 is separated into the second layer 20A and the second layer 20B by the cleavage. In the third member 402, the second layer 20A includes a carbonaceous material region 22B. Moreover, a member 502 including the first layer 10 and the second layer 20B is obtained by the cleavage, and the second layer 20B includes a carbonaceous material region 22C.

A region where a cross-sectional area in a direction illustrated in FIG. 11, the cross-sectional area being occupied by the carbonaceous material 22A by 30% or more, is defined as the carbonaceous material region 22. When an amount of the carbonaceous material 22A is small or the carbonaceous material 22A is biased, it is difficult to cleave the second layer 20. Accordingly, it is preferable to adjust the laser heating so that the carbonaceous material region 22 includes a large amount of the carbonaceous material 22A with less bias.

Then, the second layer 20A including the carbonaceous material region 22B in the third member 402 is removed, and further, the intermediate layer of the third layer 30 therein is removed according to needs, whereby the fourth member can be obtained.

The irradiation position of the laser is shifted from the center of the second layer 20 toward the third layer 30 or the first layer 10, whereby such a position where the carbonaceous material region 22 is formed can be changed.

Second Embodiment

A second embodiment relates to a manufacturing method of a semiconductor device and to a support for use in manufacturing the semiconductor device. The second embodiment is a modified example of the first embodiment, and a description of contents common to the second embodiment and the first embodiment will be omitted.

Figure 13:
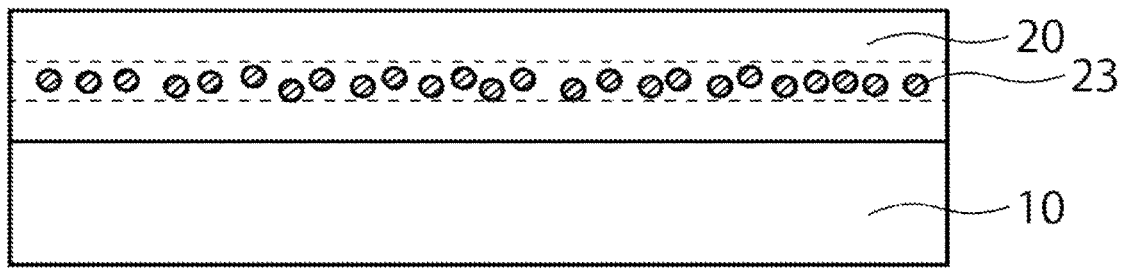
FIG. 13 is a conceptual diagram of a support according to an embodiment.

FIG. 13 illustrates a support 110 of the second embodiment. The support 110 includes a first layer 10 and a second layer 20 containing metal particles 23. The metal particles 23 are unevenly distributed in a region surrounded by broken lines. The metal particles 23 can serve as nuclei to form a carbonaceous material regioselectively. The metal particles 23 are preferably a carbon solid solution precipitation catalyst. The metal particles 23 are preferably particles of at least one metal selected from the group consisting of W, Ta, Cu, Ti, V, Cr, Nb, Mo, Zr, Hf, Co, Sc, Mn, Fe, Ni, Au, Ag, Pt, and Pd or particles of an alloy containing the at least one metal. Considering a carbon solid solution precipitation catalyst activity, the metal particles 23 are more preferably particles of at least one metal selected from the group consisting of Fe, Ta and Mo, or particles of an alloys containing the at least one metal.

A size of the metal particles 23 is not particularly limited, but an average primary diameter thereof is preferably 1 nm or more and 10 nm or less. The metal particles 23 may be partially aggregated. The second layer 20 preferably includes the metal particles 23 of 1 wt % or more and 5 wt % or less. When an amount of the metal particles 23 is too small, it becomes difficult to form the carbonaceous material with a high density. Meanwhile, when the amount of metal particles 23 is too large, it becomes difficult to peel off a part of the second layer 20.

In order to form the metal particles 23 during the film formation of the second layer 20, for example, metal particles just need to be sputtered in an inert gas atmosphere to form the metal particles 23 on the surface of the second layer 20 during the film formation, and the film formation of the second layer 20 just needs to be then resumed. Even in the first embodiment, the metal particles 23 are formed so as to be dispersed in the second layer 20, whereby the formation of the carbonaceous material layer 21 and the carbonaceous material 22A (carbonaceous material region 22) can be promoted.

Next, the manufacturing method of a semiconductor device according to the second embodiment will be described more specifically with reference to process conceptual diagrams of the manufacturing method of a semiconductor device in FIGS. 14 to 16.

Figure 14:
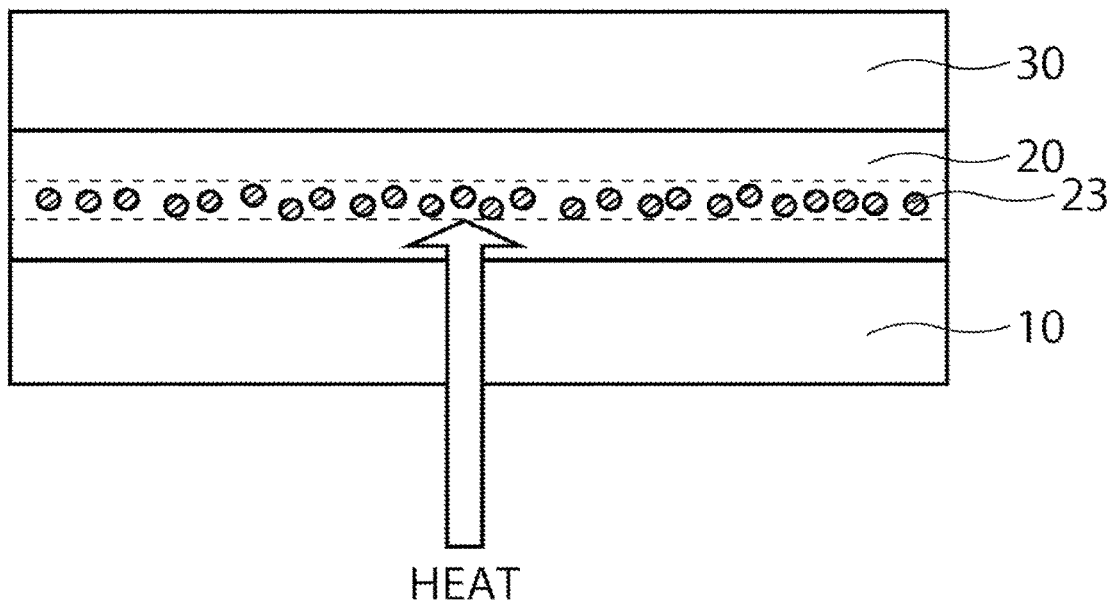
FIG. 14 is a process conceptual diagram of the manufacturing method of a semiconductor device according to the embodiment.

First, there is performed the step (S12) of forming the third layer 30 on the surface of the second layer 20 of the support 110 illustrated in the conceptual diagram of FIG. 13 to obtain a first member 210 illustrated in the process conceptual diagram of FIG. 14.

Figure 15:
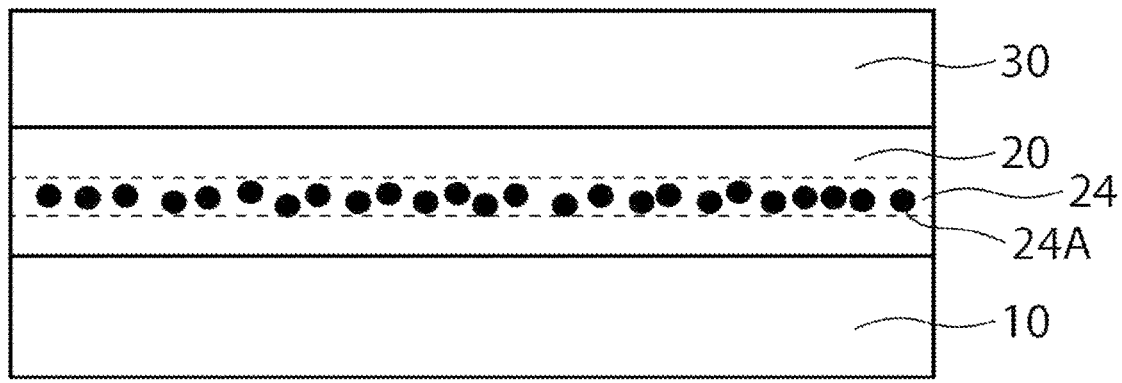
FIG. 15 is a process conceptual diagram of the manufacturing method of a semiconductor device according to the embodiment.

Next, there is performed the step (S13) of selectively heating a region of the first member 210, which is surrounded by broken lines as illustrated in the process conceptual diagram of FIG. 14, and obtaining a second member 310 in which there are formed particles 24A formed by attaching the carbonaceous material to the metal particles 23 serving as nuclei as illustrated in the process conceptual diagram of FIG. 15 or particles 24A formed by coating the metal particles 23 with the carbonaceous material as illustrated therein. The region surrounded by the broken lines is cooled after being heated. Then, the metal particles 23 are formed regioselectively, and the above region is also heated regioselectively, whereby the particles 24A formed by attaching the carbonaceous material onto the metal particles 23 or the particles 24A formed by coating the metal particles 23 with the carbonaceous material are formed at a high density regioselectively in the carbonaceous material region 24 illustrated by the broken lines.

Figure 16:
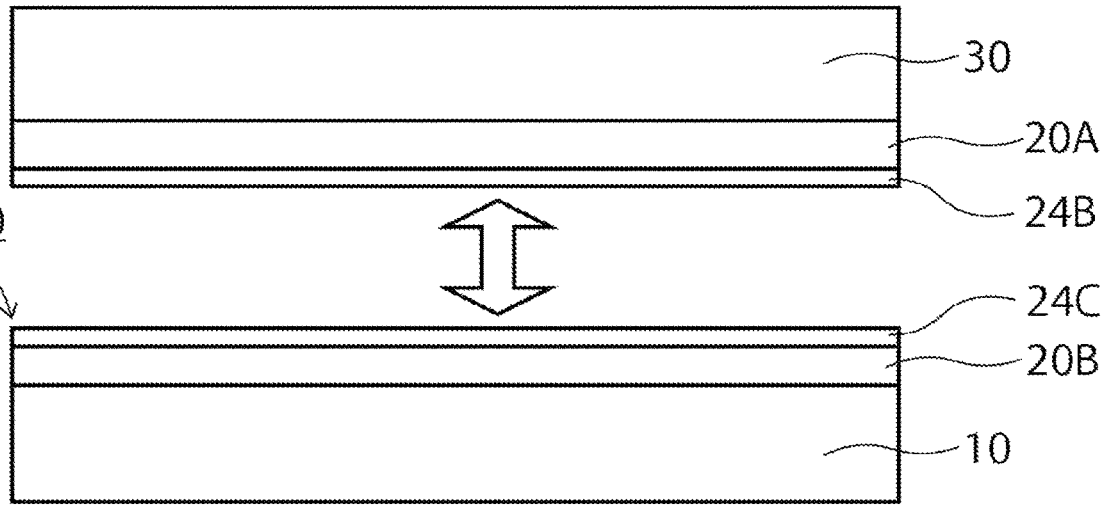
FIG. 16 is a process conceptual diagram of the manufacturing method of a semiconductor device according to the embodiment.

Next, as illustrated in the process conceptual diagram of FIG. 16, there is performed the step (S20) of cleaving the second member 310 from the carbonaceous material region 24 to obtain a third member 410 including the third layer 30. The second layer 20 is separated into the second layer 20A and the second layer 20B by the cleavage. In the third member 410, the second layer 20A includes a carbonaceous material region 24B. Moreover, the member 502 including the first layer 10 and the second layer 20B is obtained by the cleavage, and the second layer 20B includes a carbonaceous material region 24C.

Then, the second layer 20B including the carbonaceous material region 24B in the third member 410 is removed, and further, the intermediate layer of the third layer 30 therein is removed according to needs, whereby the fourth member can be obtained.

Moreover, for example, in the step (S11) of forming the second layer 20, a position where the metal particles 23 are formed is adjusted, whereby a position of the carbonaceous material region 24 can be changed close to either the first layer 10 or the third layer 30.

Figure 17:
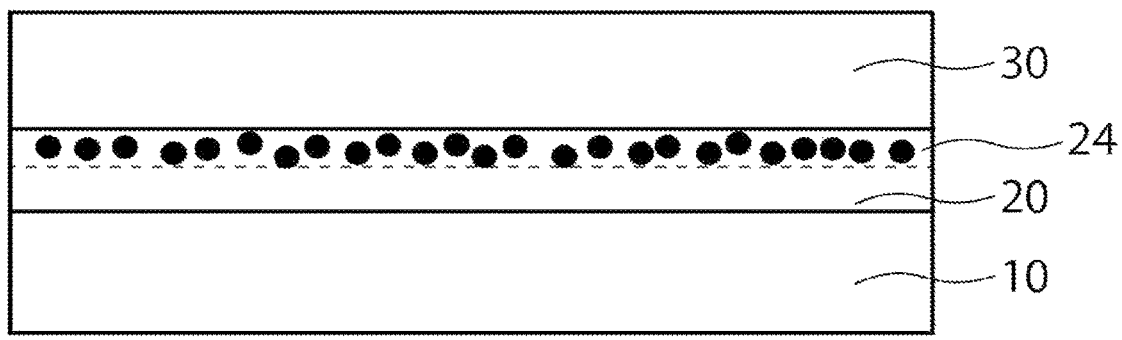
FIG. 17 is a process conceptual diagram of the manufacturing method of a semiconductor device according to the embodiment.

For example, in the step (S11) of forming the second layer 20, metal particles 23A can be formed close to an opposite surface of the second layer 20, which is remote from the first layer 10. By using such a support, as illustrated in the process conceptual diagram of FIG. 17, after the heat treatment step (S20), a second member 311 can be obtained, in which the carbonaceous material region 24 that includes the particles 24A at a high density is formed close to the third layer 30. When the second member 311 is cleaved, a cleavage position can be changed so that the second layer 20A included in the third member becomes thin.

Then, the second layer 20B including the carbonaceous material region 24B in the third member is removed, and further, the intermediate layer of the third layer 30 therein is removed according to needs, whereby the fourth member can be obtained.

Figure 18:
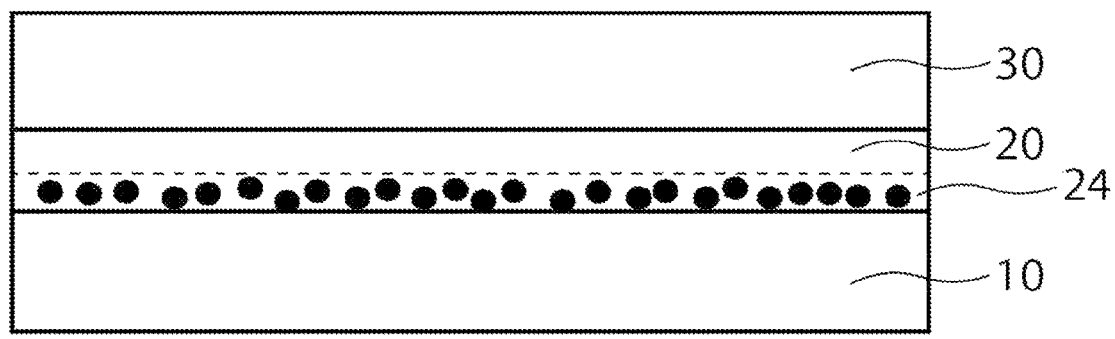
FIG. 18 is a process conceptual diagram of the manufacturing method of a semiconductor device according to the embodiment.

Moreover, in the step (S11) of forming the second layer 20, the metal particles 23 can be formed in the region of the second layer 20, which is close to the first layer 10. By using such a support, as illustrated in the process conceptual diagram of FIG. 18, after the heat treatment step (S20), a second member 312 can be obtained, in which the carbonaceous material region 24 that includes the particles 24A at a high density is formed close to the first layer 10. When the second member 312 is cleaved, the cleavage position can be changed so that the second layer 20A included in the third member becomes thick.

Third Embodiment

A third embodiment relates to a manufacturing method of a semiconductor device and to a support for use in manufacturing the semiconductor device. The third embodiment is a modified example of the first embodiment and the second embodiment, and a description of contents common to the third embodiment and the first embodiment and of contents common to the third embodiment and the second embodiment will be omitted.

Figure 19:
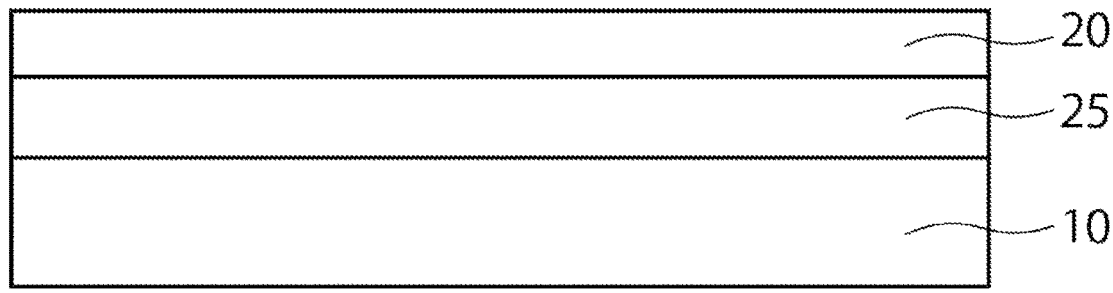
FIG. 19 is a conceptual diagram of a support according to an embodiment.

FIG. 19 illustrates a support 120 of the third embodiment. The support 120 includes a first layer 10, a metal layer 25 and a second layer 20. The metal layer 25 is preferably in direct contact with a surface of the second layer 20. The metal layer 25 preferably contains a metal that is a carbon solid solution precipitation catalyst. The metal layer 25 is preferably a layer of at least one metal selected from the group consisting of W, Ta, Cu, Ti, V, Cr, Nb, Mo, Zr, Hf, Co, Sc, Mn, Fe, Ni, Au, Ag, Pt, and Pd or a layer of an alloy containing the at least one metal. The metal layer 25 may be a laminated body in which a plurality of layers composed of different elements are laminated on one another. Considering a carbon solid solution precipitation catalyst activity, the metal layer 25 is more preferably a layer of at least one metal selected from the group consisting of Fe, Ta and Mo, or a layer of an alloys containing the at least one metal. A thickness of the metal layer 25 is preferably 1 nm or more and 100 nm or less.

Next, the manufacturing method of a semiconductor device according to the third embodiment will be described more specifically with reference to process conceptual diagrams of the manufacturing method of a semiconductor device in FIGS. 20 to 22.

Figure 20:
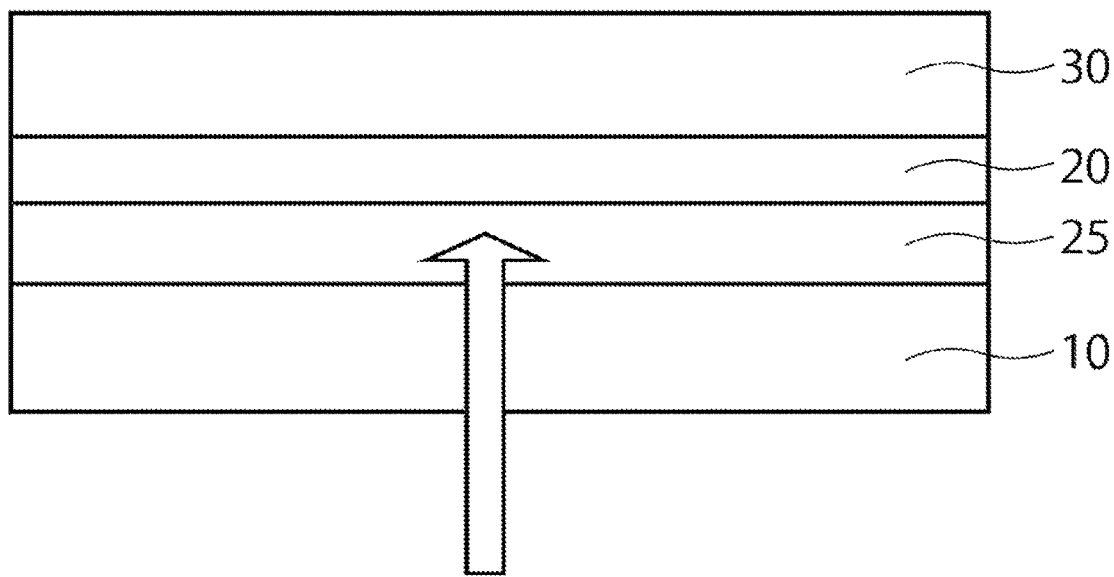
FIG. 20 is a process conceptual diagram of the manufacturing method of a semiconductor device according to the embodiment.
Figure 21:
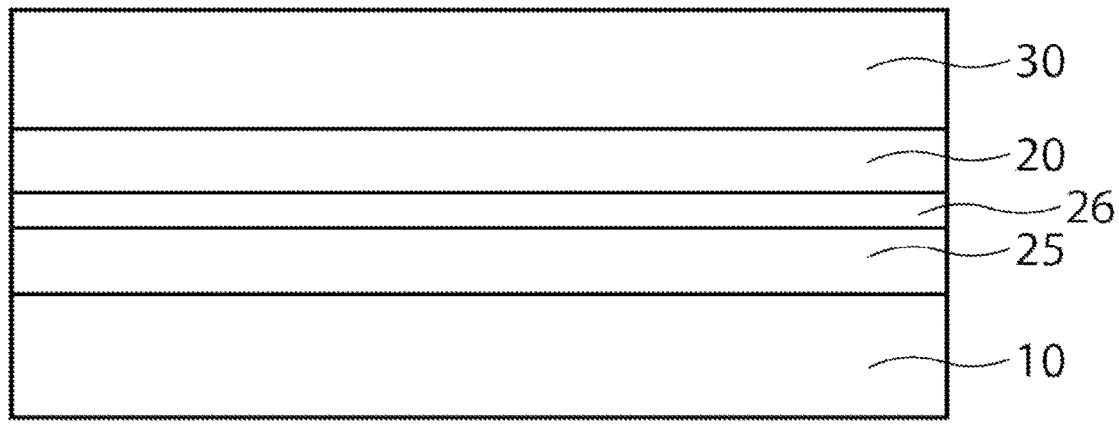
FIG. 21 is a process conceptual diagram of the manufacturing method of a semiconductor device according to the embodiment.

First, for a first member 220 obtained by forming the third layer 30 on a surface of a second layer 20 of a support 120 illustrated in the conceptual diagram of FIG. 19, as illustrated in the process conceptual diagram of FIG. 20, the vicinity of an interface between the second layer 20 and the metal layer 25 in the first member 220 is selectively heated (S13). By heating, a second member 320 is obtained, in which a carbonaceous material layer 26 is formed between the second layer 20 and the metal layer 25 as illustrated in the process conceptual diagram of FIG. 21.

Figure 22:
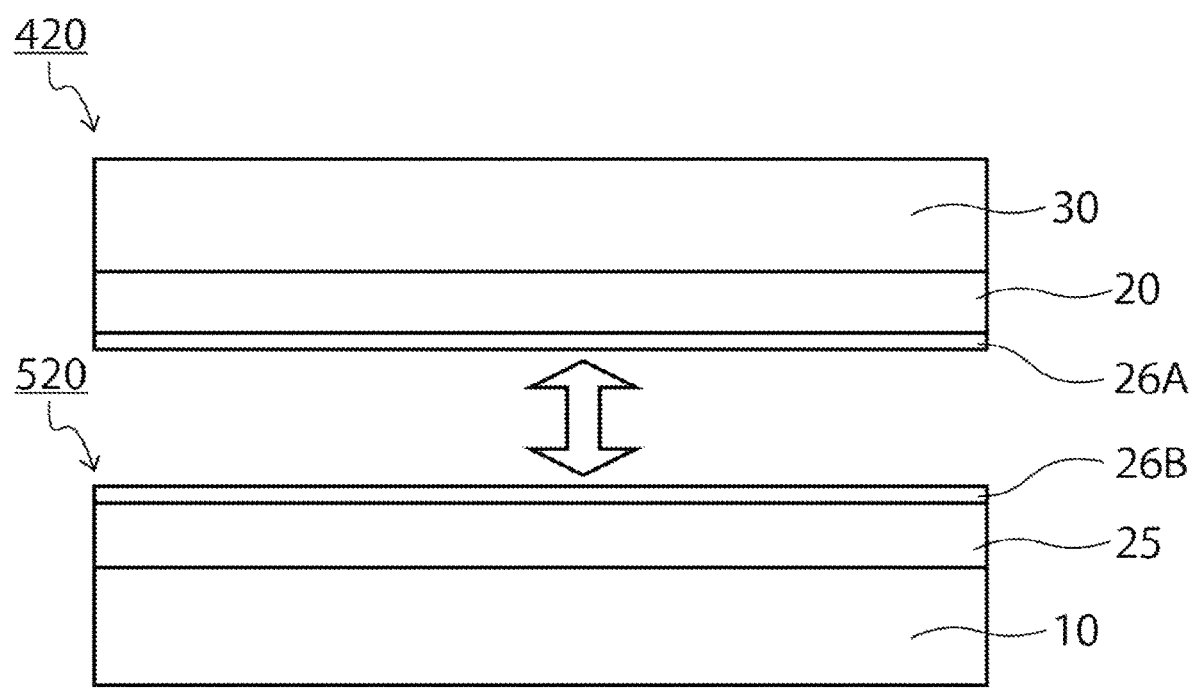
FIG. 22 is a process conceptual diagram of the manufacturing method of a semiconductor device according to the embodiment.

Next, there is performed the step (S20) of cleaving the second member 320 from the carbonaceous material layer 26 to obtain a third member 420 including the second layer 20 and the third layer 30 as illustrated in the process conceptual diagram of FIG. 22. A member 520 including the first layer 10 and the metal layer 25 is also obtained by the cleavage. The carbonaceous material layer 26 is separated into a carbonaceous material layer 26A of the third member 420 and a carbonaceous material layer 26B of the member 520.

Then, the carbonaceous material layer 26A and the second layer 20 in the third member 420 are removed, and further, the intermediate layer of the third layer 30 thereof is removed according to needs, whereby the fourth member can be obtained.

Moreover, for example, the position to be cleaved can be selected by changing the order and the number of steps of forming the metal layer 25 and forming the second layer 20.

Figure 23:
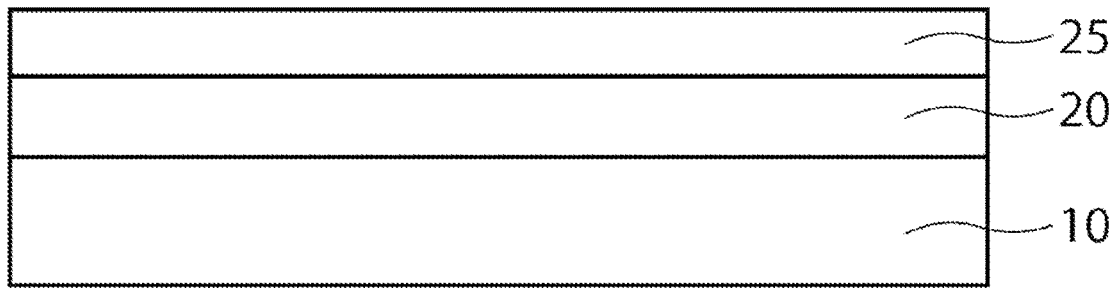
FIG. 23 is a conceptual diagram of a support according to the embodiment.
Figure 24:
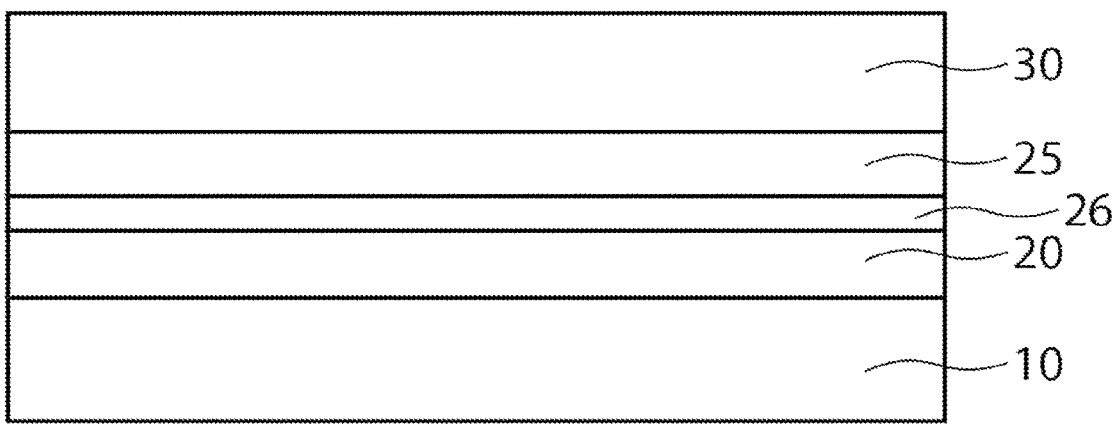
FIG. 24 is a process conceptual diagram of the manufacturing method of a semiconductor device according to the embodiment.

For example, a support 121 in which the second layer 20 is provided between the first layer 10 and the metal layer 25, the support 121 being illustrated in a conceptual diagram of FIG. 23, can also be used. By using the support 121 illustrated in the conceptual diagram of FIG. 23, the third layer 30 is formed on the metal layer 25 provided on the second layer 20 (S12), whereby the first member can be obtained. Then, a treatment (S13) of selectively heating the vicinity of the interface between the second layer 20 and the metal layer 25 in the first member is performed, whereby a second member 321 can be obtained, in which the carbonaceous material layer 26 illustrated in the process conceptual diagram of FIG. 24 is formed between the second layer 20 and the metal layer 25.

Figure 25:
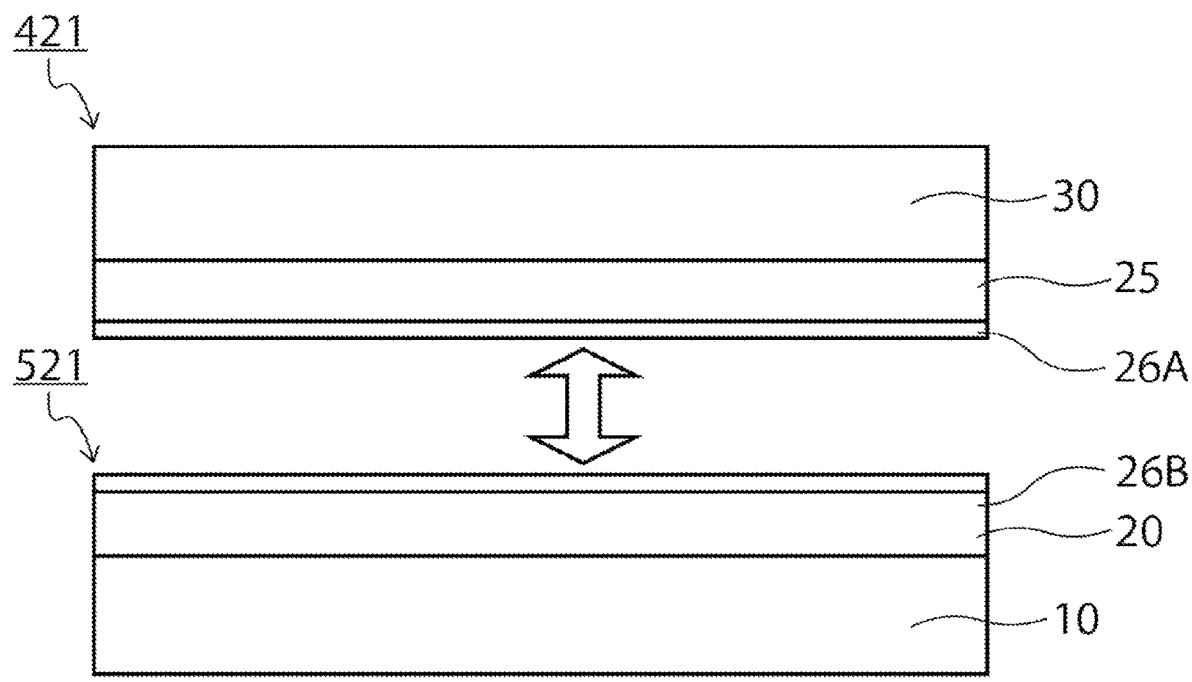
FIG. 25 is a process conceptual diagram of the manufacturing method of a semiconductor device according to the embodiment.

Next, there is performed a step (S20) of cleaving the second member 321 from the carbonaceous material layer 26 to obtain a third member 421 including the metal layer 25 and the third layer 30 as illustrated in the process conceptual diagram of FIG. 25. A member 521 including the first layer 10 and the second layer 20 is also obtained by the cleavage. The carbonaceous material layer 26 is separated into the carbonaceous material layer 26A of the third member 421 and the carbonaceous material layer 26B of the member 521.

Then, the carbonaceous material layer 26B of the third member 421 is removed, and further, the intermediate layer of the third layer 30 thereof is removed according to needs, whereby the fourth member can be obtained.

Figure 26:
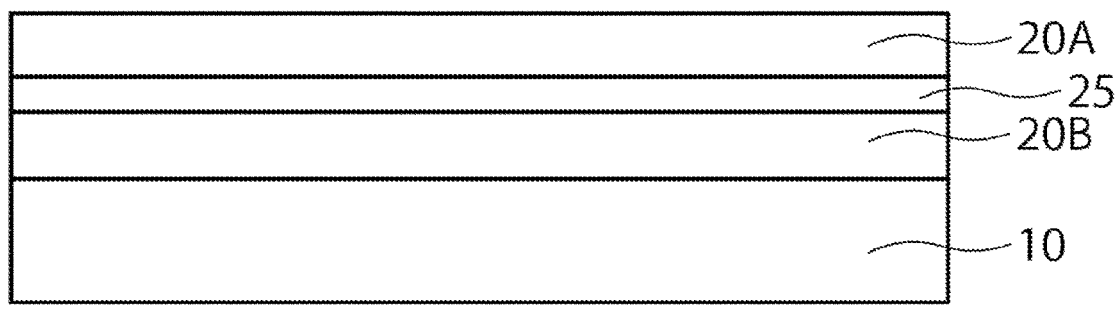
FIG. 26 is a conceptual diagram of a support according to the embodiment.
Figure 27:
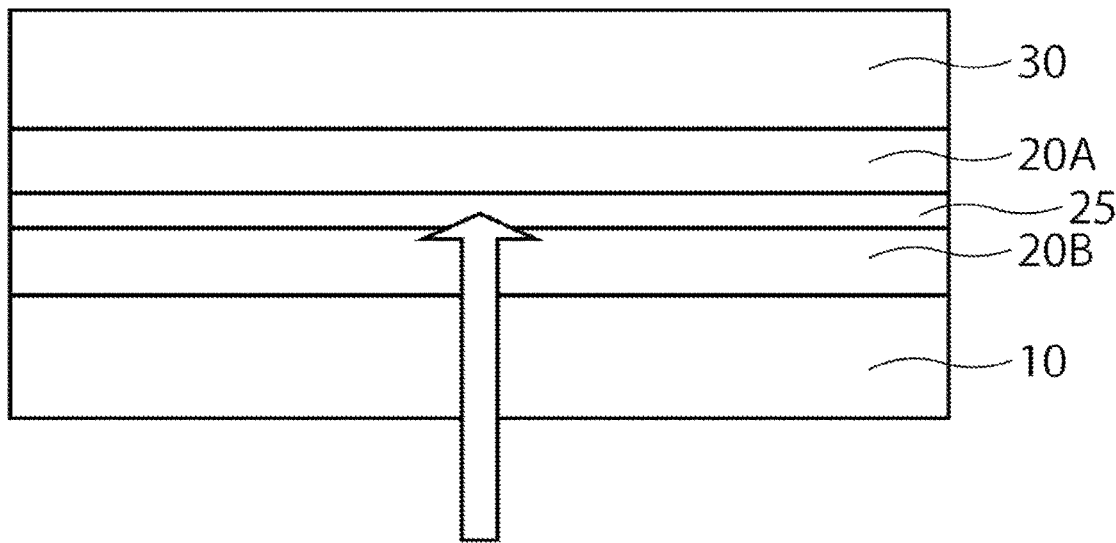
FIG. 27 is a conceptual diagram of the support according to the embodiment.
Figure 28:
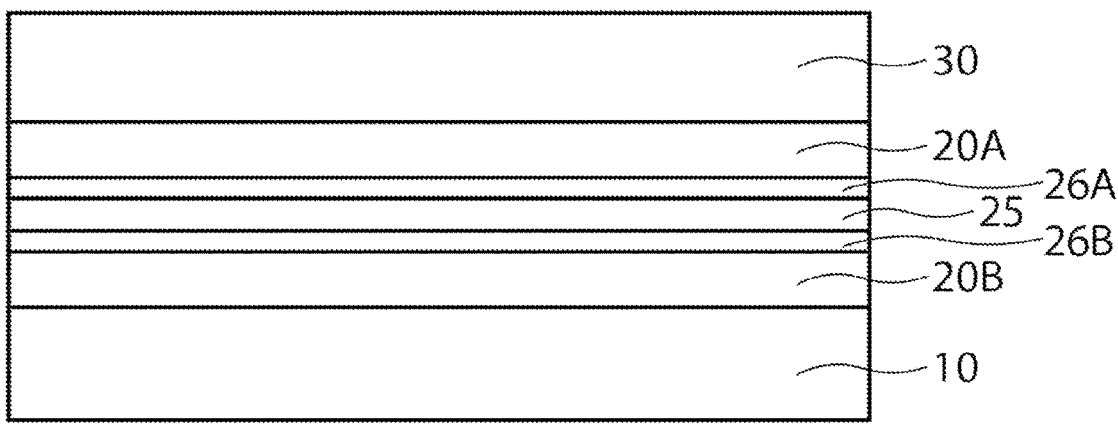
FIG. 28 is a process conceptual diagram of the manufacturing method of a semiconductor device according to the embodiment.

Moreover, a support 122 in which the metal layer 25 is provided between the second layer 20A and the second layer 20B, the support 122 being illustrated in a conceptual diagram of FIG. 26, can be used. By using the support 122 illustrated in the conceptual diagram of FIG. 26, the third layer 30 is formed on the second layer 20A (S12), whereby a first member 222 illustrated in a process conceptual diagram of FIG. 27 can be obtained. Then, as illustrated in the process conceptual diagram of FIG. 27, a treatment (S13) of heating the metal layer 25 of the first member 222 and the second layers 20A and 20B in the vicinity thereof is performed, whereby a second member 322 can be obtained, in which the carbonaceous material layer 26A is formed between the metal layer 25 and the second layer 20A as illustrated in a process conceptual diagram of FIG. 28, and the carbonaceous material layer 26B is provided between the metal layer 25 and the second layer 20B as illustrated therein.

Figure 29:
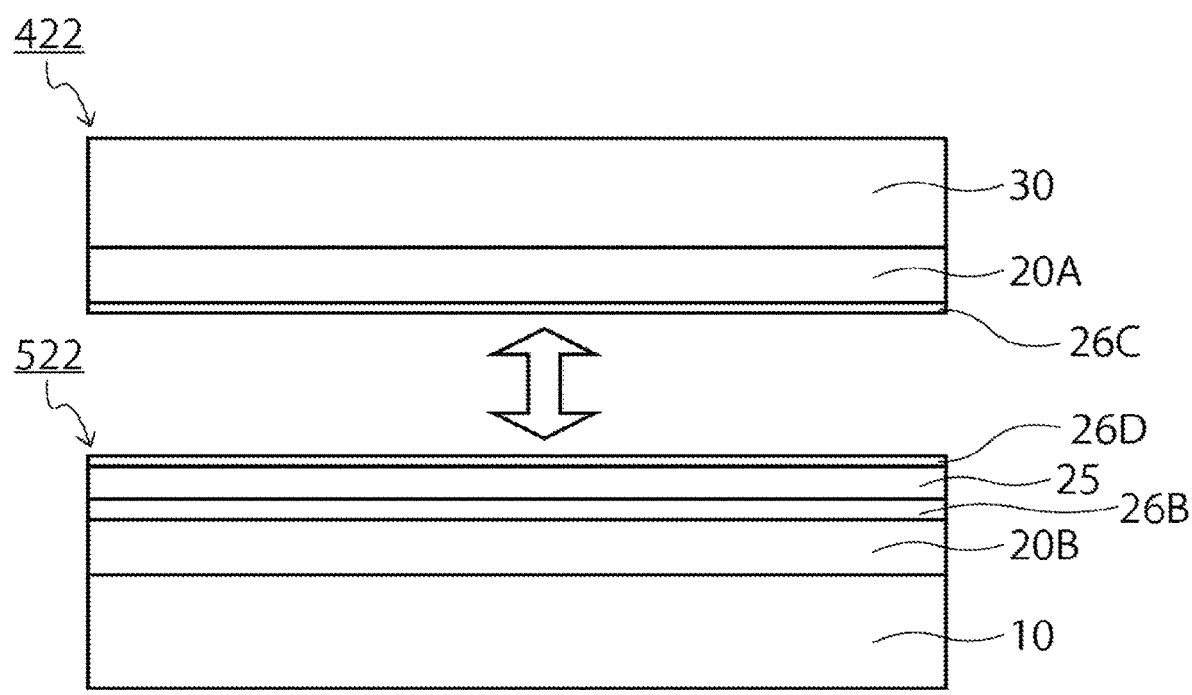
FIG. 29 is a process conceptual diagram of the manufacturing method of a semiconductor device according to the embodiment.

Next, there is performed the step (S20) of cleaving the second member 322 from the carbonaceous material layer 26A to obtain a third member 422 including the second layer 20A and the third layer 30 as illustrated in a process conceptual diagram of FIG. 29. By the cleavage, a member 522 including the first layer 10, the second layer 20B, the carbonaceous material layer 26B and the metal layer 25 is also obtained. The carbonaceous material layer 26A is separated into a carbonaceous material layer 26C of the third member 422 and a carbonaceous material layer 26D of the member 522.

Then, the second layer 20A and carbonaceous material layer 26C of the third member 422 are removed, and further, the intermediate layer of the third layer 30 thereof is removed according to needs, whereby the fourth member can be obtained.

Figure 30:
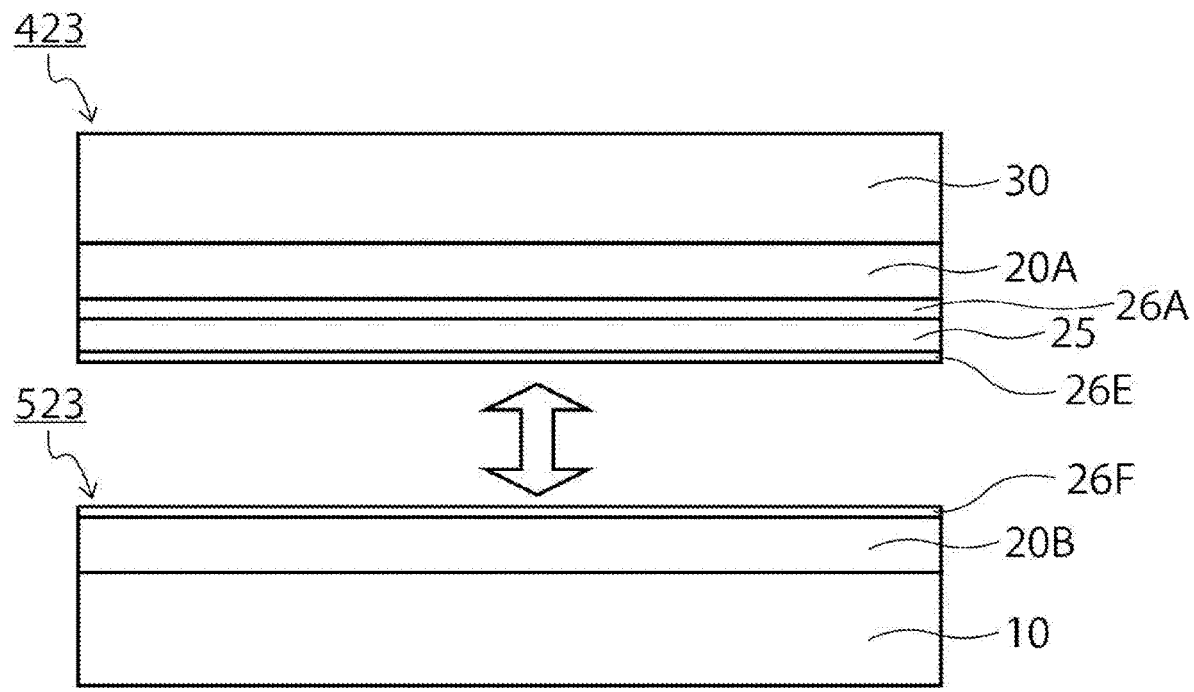
FIG. 30 is a process conceptual diagram of the manufacturing method of a semiconductor device according to the embodiment.

Since the second member 322 includes two carbonaceous material layers 26A and 26B, the second member 322 can be cleaved from the carbonaceous material layer 26B. There is performed the step (S20) of cleaving the second member 322 from the carbonaceous material layer 26B to obtain a third member 423 including the metal layer 25, the carbonaceous material layer 26A, the second layer 20A and the third layer 30 as illustrated in a process conceptual diagram of FIG. 30. A member 523 including the first layer 10 and the second layer 20B is also obtained by the cleavage. The carbonaceous material layer 26B is separated into a carbonaceous material layer 26E of the third member 423 and a carbonaceous material layer 26F of the member 523.

Then, the carbonaceous material layer 26E, the metal layer 25, the second layer 20A and the carbonaceous material layer 26A in the third member 423 are removed, and further, the intermediate layer of the third layer 30 thereof is removed according to needs, whereby the fourth member can be obtained.

Fourth Embodiment

A fourth embodiment relates to a manufacturing method of a semiconductor device and to a support for use in manufacturing the semiconductor device. The fourth embodiment is a modified example of the first embodiment, the second embodiment and the third embodiment, and a description of contents common to the fourth embodiment and the first embodiment, of contents common to the fourth embodiment and the second embodiment, and of contents common to the fourth embodiment and the third embodiment will be omitted.

The fourth embodiment relates to a manufacturing method for obtaining a semiconductor package by forming a wiring layer on a support, providing a semiconductor chip thereon, and then forming a carbonaceous material layer and peeling the carbonaceous material layer.

The intermediate layer may be regarded as a part of the first layer 10, may be regarded as a part of the third layer 30, or may be regarded as a layer different from the first layer and the third layer 30.

Figure 31:
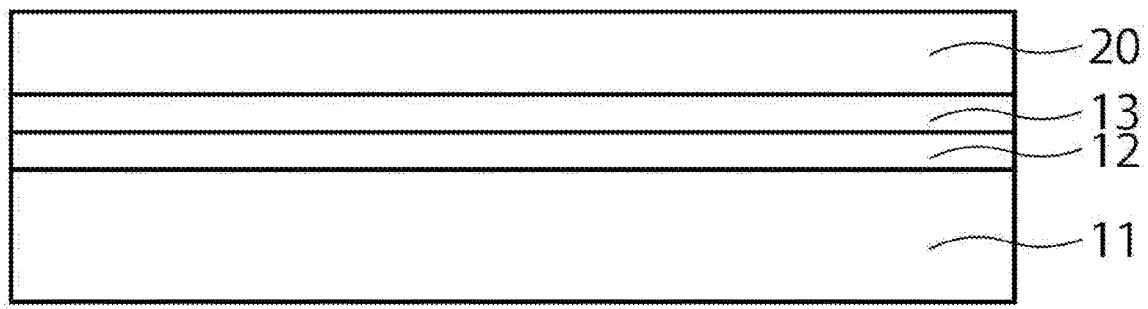
FIG. 31 is a conceptual diagram of a support according to the embodiment.

FIG. 31 illustrates a support 130 of the fourth embodiment. The support 130 includes a first layer 10 including a support layer 11, an adhesion layer 41 and an underlayer 42, and a second layer 20. The adhesion layer 41 and the underlayer 42 are intermediate layers omitted in the first to third embodiments. The adhesion layer 41 and the underlayer 42 are examples of the intermediate layers, and the intermediate layers are not limited to these. Moreover, as such an intermediate layer, either the adhesion layer 41 or the underlayer 42 may be provided between the support layer 11 and the second layer 20.

The adhesion layer 41 is a layer that improves adhesion between the support layer 11 and the underlayer 42 or between the support layer 11 and the second layer 20. For example, the adhesion layer 41 is preferably a layer containing at least one selected from the group consisting of Ti, Ta and Co. The adhesion layer 41 may be a single layer or a laminated body.

The underlayer 42 is an underlayer for forming the second layer 20. For example, the underlayer 42 is a layer provided for the purpose of preventing an unintended intermetallic reaction between the second layer 20 and the adhesion layer 41 or unintended oxidation reaction of the second layer 20 to suppress peeling before laser heating, or promoting peeling between the second layer 20 and the underlayer 42 after the laser heating. For example, the underlayer 42 is preferably a layer containing at least one selected from the group consisting of W, Ta, Cu, Ti, V, Cr, Nb, Mo, Zr, Hf, Co, Sc, Mn, Fe, Ni, Au, Ag, Pt and Pd. The underlayer 42 may be a single layer or a laminated body.

Next, referring to FIGS. 32 to 37, a description will be given of a manufacturing method of a semiconductor device, which uses the support 130 illustrated in FIG. 31. First, as illustrated in a process conceptual diagram of FIG. 32, the metal layer 25 is formed on the second layer 20 of the support 130 to obtain a member 131. The member 131 can also be used as a support.

Figure 32:
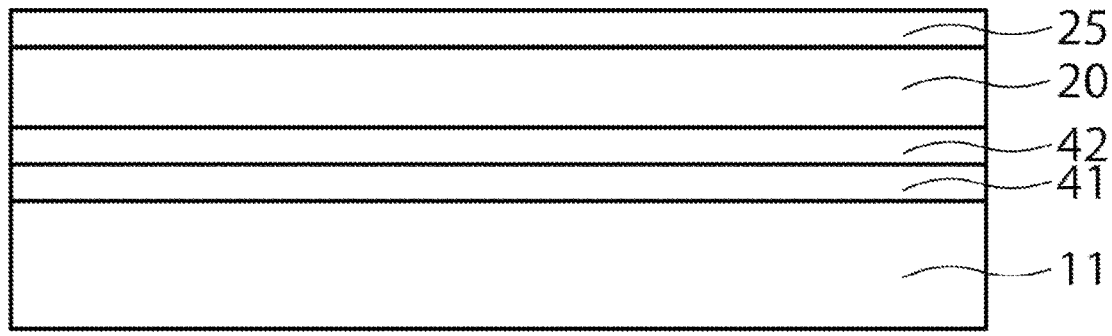
FIG. 32 is a process conceptual diagram of the manufacturing method of a semiconductor device according to the embodiment.
Figure 33:
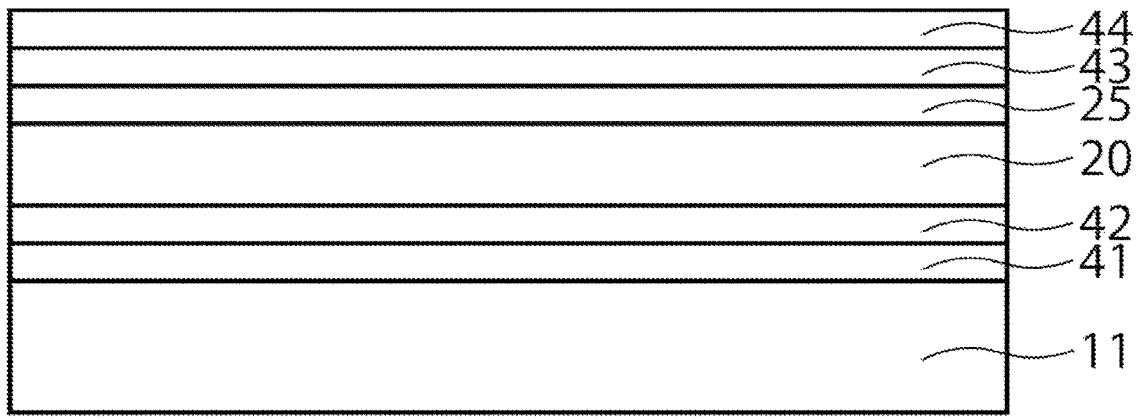
FIG. 33 is a process conceptual diagram of the manufacturing method of a semiconductor device according to the embodiment.

Next, as illustrated in the process conceptual diagram of FIG. 33, a heat dissipation layer 43 and a protective layer 44 are formed on the metal layer 25 of the member 131 of FIG. 32 to obtain a member 132. The member 132 can also be used as a support.

The heat dissipation layer 43 suppresses a temperature rise of the second layer 20 during the formation of the third layer 30, and suppresses a temperature rise of the third layer 30 due to the heating during the formation of the carbonaceous material. For example, the heat dissipation layer 43 is preferably a layer containing at least one selected from the group consisting of Au, Ag, Cu, Al, Be and Mg. The heat dissipation layer 43 may be a single layer or a laminated body.

The protective layer 44 is a layer provided for the purpose of protecting the wiring layer 31, for example, at the time of the laser heating or when the second layer 20 and the heat dissipation layer 43 are removed. For example, the protective layer 44 is preferably a layer containing at least one selected from the group consisting of polyimide, polybenzoxazole, epoxy resin, a silicon oxide film, a silicon nitride film, Ta, Cu, Ti, V, Cr, Co, Ni, Au, Ag, Pt and Pd. The protective layer 44 may be a single layer or a laminated body.

Figure 34:
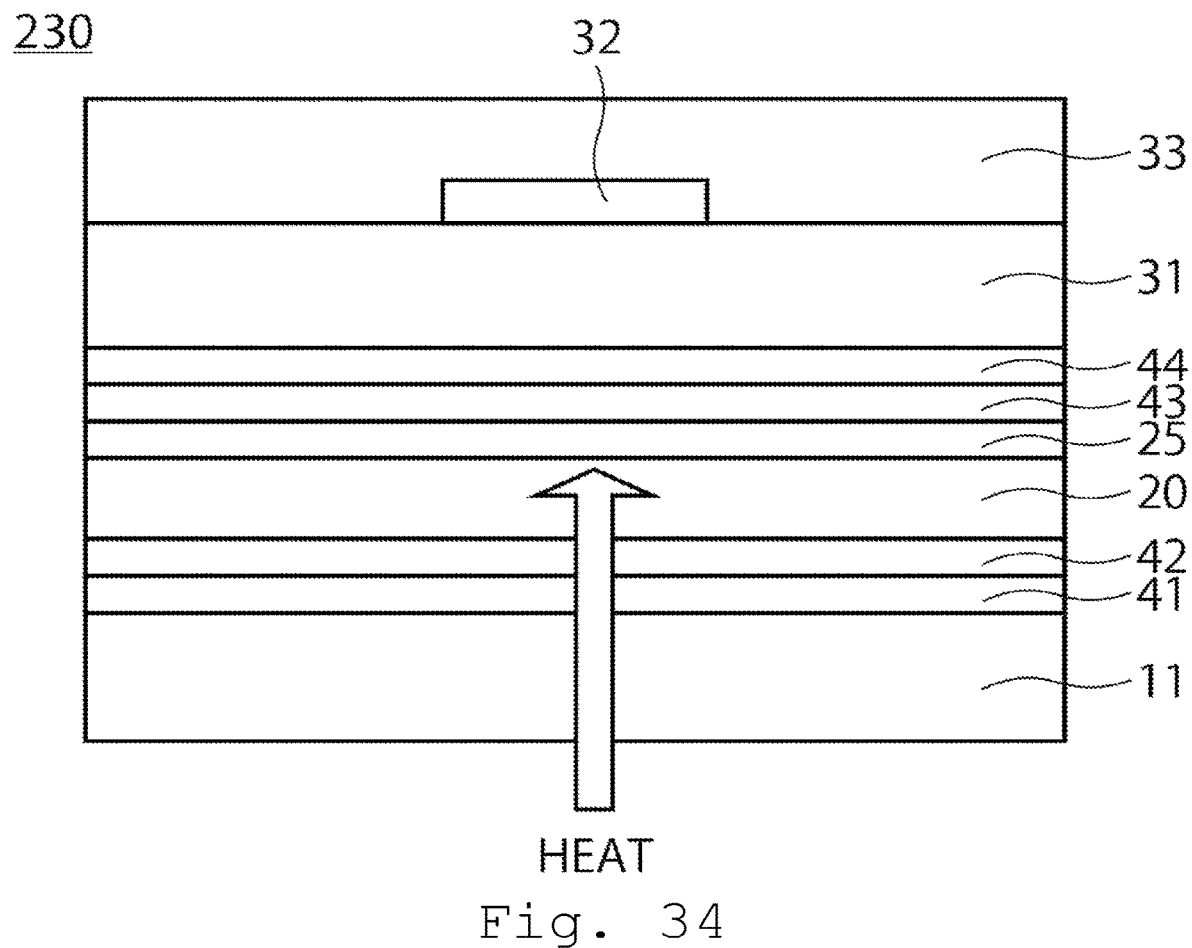
FIG. 34 is a process conceptual diagram of the manufacturing method of a semiconductor device according to the embodiment.

Next, as illustrated in a process conceptual diagram of FIG. 34, the wiring layer 31 is formed on the protective layer 44 of the member 132 of FIG. 33, then a semiconductor chip 32 is mounted on the wiring layer 31, and then a sealing material 33 is formed to seal the semiconductor chip 32, whereby a first member 230 illustrated in the process conceptual diagram of FIG. 34 is obtained (S12). The wiring layer 31, the semiconductor chip 32, and the sealing material 33 are included in the third layer 30. Since the wiring layer 31 is not formed on a wafer, a semiconductor device thus obtained can be thinned.

Figure 35:
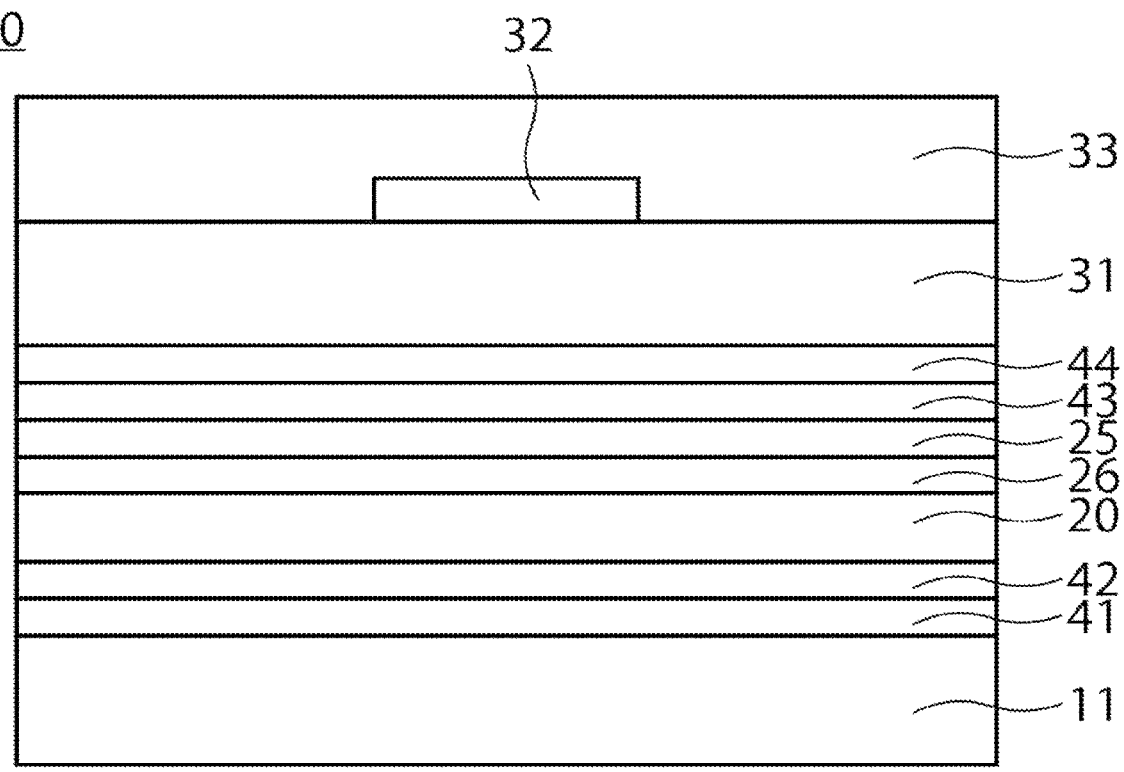
FIG. 35 is a process conceptual diagram of the manufacturing method of a semiconductor device according to the embodiment.

Next, the vicinity of an interface between the second layer 20 and the metal layer 25 in the first member 230 illustrated in the process conceptual diagram of FIG. 34 is heated, and a second member 330 is obtained, in which a carbonaceous material layer 26 is formed between the second layer 20 and the metal layer 25, which are illustrated in the process conceptual diagram of FIG. 35 (S13).

Figure 36:
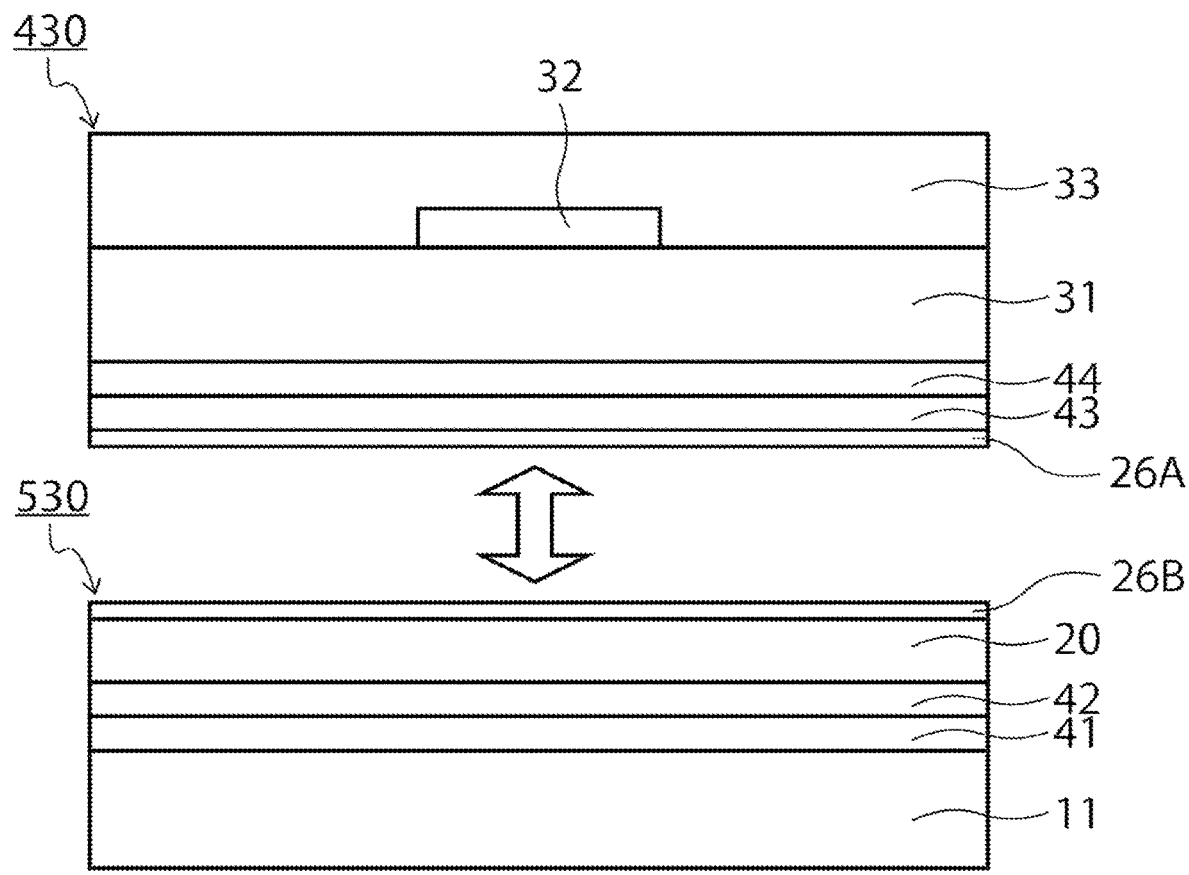
FIG. 36 is a process conceptual diagram of the manufacturing method of a semiconductor device according to the embodiment.

Next, as illustrated in a process conceptual diagram of FIG. 36, the second member 330 is cleaved from the carbonaceous material layer 26 to obtain a third member 430 (S20). The third member 430 includes the heat dissipation layer 43, the protective layer 44, the wiring layer 31, the semiconductor chip 32, and the sealing material 33. Moreover, a member 530 is also obtained by the cleavage. The member 530 includes the support layer 11, the adhesion layer 41, the underlayer 42, and the second layer 20. The carbonaceous material layer 26 is separated into the carbonaceous material layer 26A of the third member 430 and the carbonaceous material layer 26B of the member 530.

Figure 37:
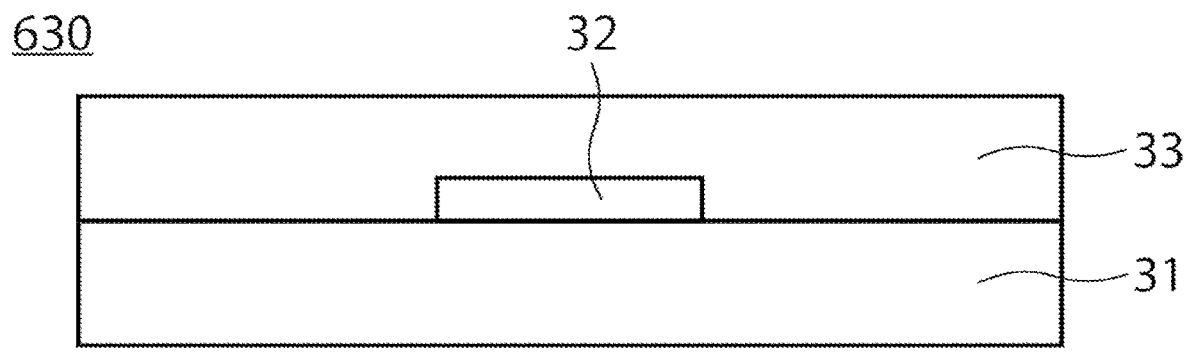
FIG. 37 is a process conceptual diagram of the manufacturing method of a semiconductor device according to the embodiment.
Figure 38:
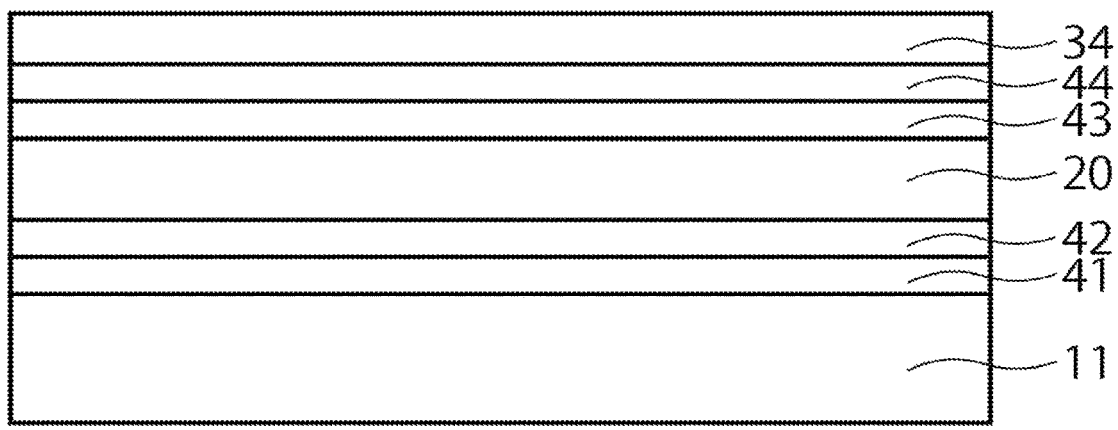
FIG. 38 is a process conceptual diagram of the manufacturing method of a semiconductor device according to the embodiment.

Then, the carbonaceous material layer 26A of the third member 430 is removed, and further, the heat dissipation layer 43 and protective layer 44 thereof, which are the intermediate layers, are removed according to needs, whereby a fourth member 630 illustrated in a process diagram of FIG. 37 can be obtained.

Fifth Embodiment

A fifth embodiment relates to a manufacturing method of a semiconductor device and to a support for use in manufacturing the semiconductor device. The fifth embodiment is a modified example of the first embodiment, the second embodiment and the third embodiment, and a description of contents common to the fifth embodiment and the first embodiment, of contents common to the fifth embodiment and the second embodiment, of contents common to the fifth embodiment and the third embodiment, and of contents common to the fifth embodiment and the fourth embodiment will be omitted.

The fifth embodiment relates to a manufacturing method for obtaining a semiconductor device by forming a semiconductor layer on a support, bonding thereonto a semiconductor layer formed on a wafer, and then forming a carbonaceous material layer and peeling the carbonaceous material layer.

A manufacturing method of a semiconductor layer according to the fifth embodiment will be described with reference to process conceptual diagrams of FIGS. 38 to 43. A first semiconductor layer 34 is formed on the member 132 of the fourth embodiment, which is illustrated in FIG. 33, to obtain a first member 240 illustrated in the process conceptual diagram of FIG. 38. Since the first semiconductor layer 34 is not formed on a thick wafer, the obtained semiconductor device can be thinned.

Figure 39:
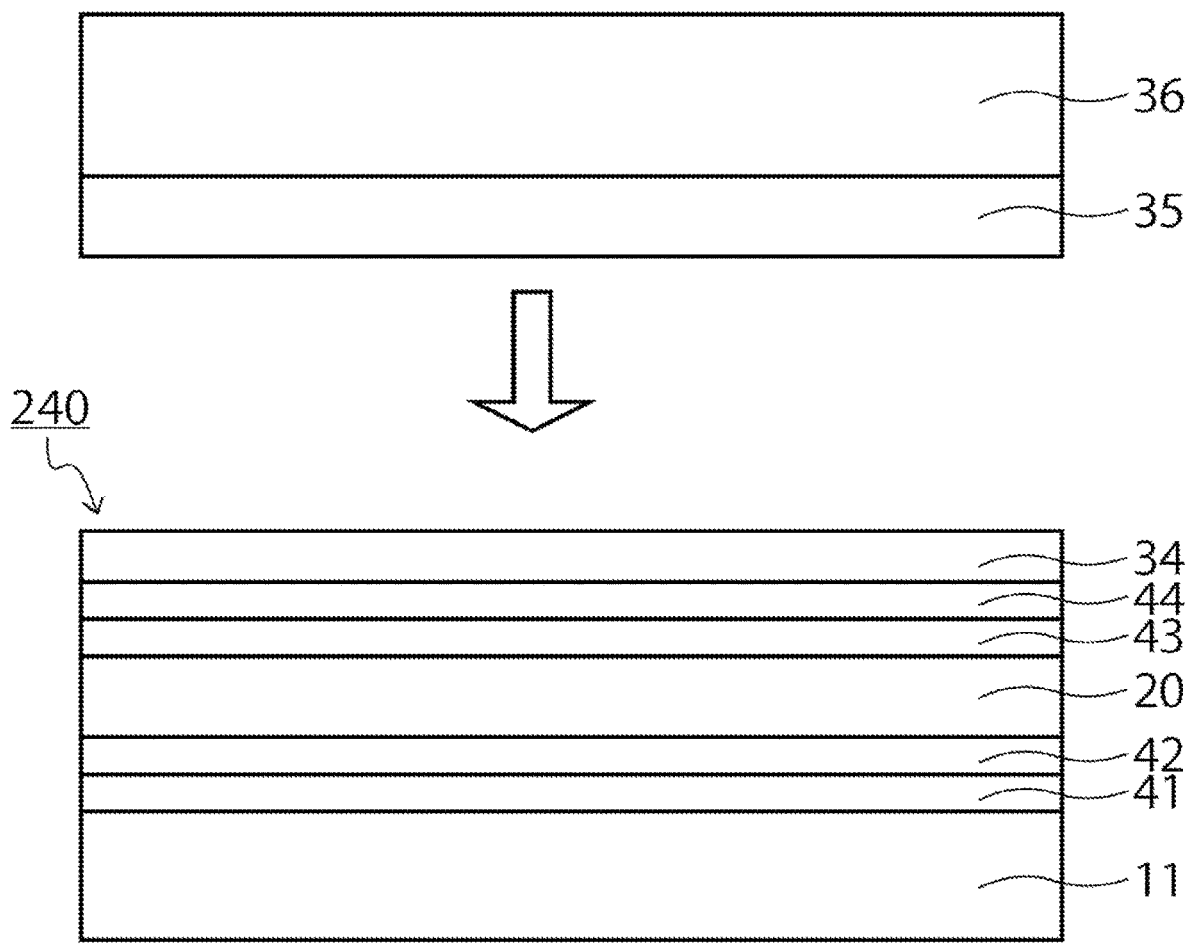
FIG. 39 is a process conceptual diagram of the manufacturing method of a semiconductor device according to the embodiment.
Figure 40:
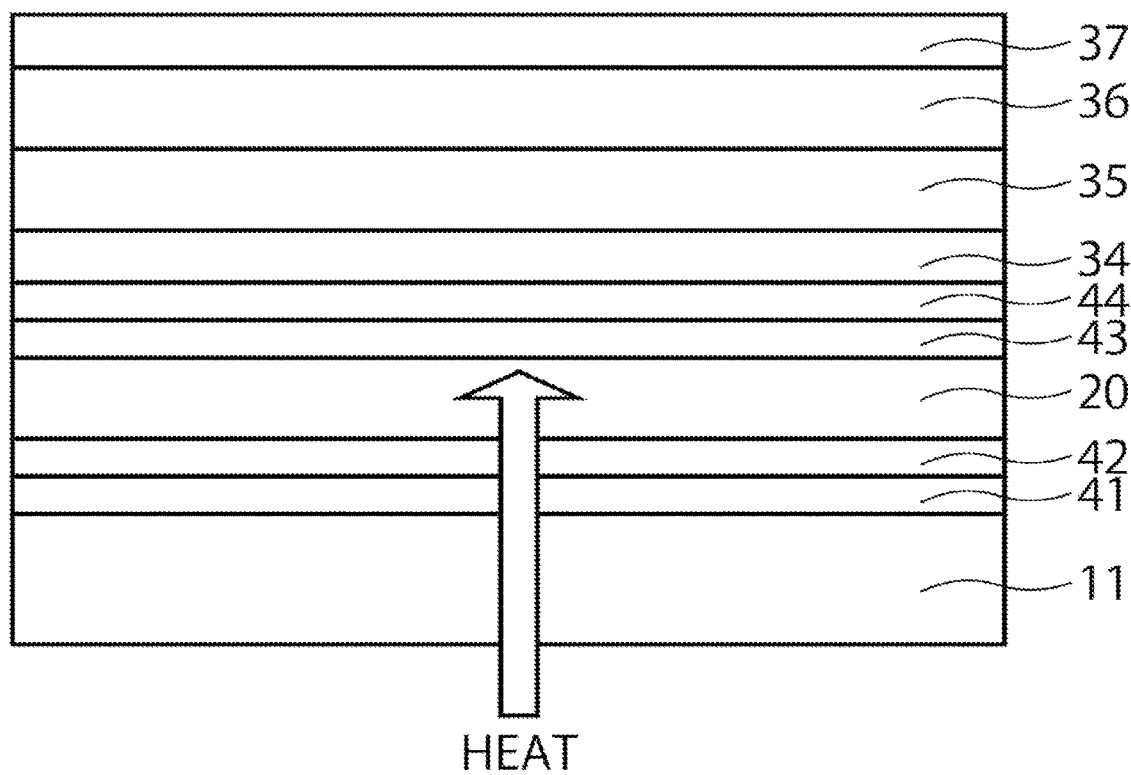
FIG. 40 is a process conceptual diagram of the manufacturing method of a semiconductor device according to the embodiment.
Figure 41:
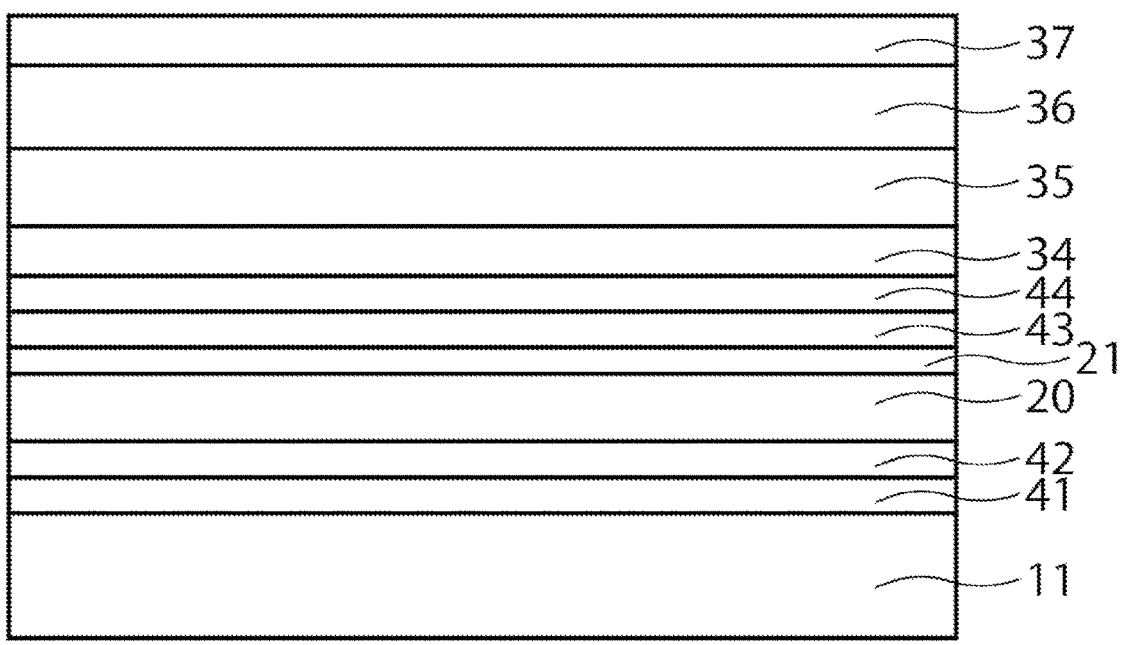
FIG. 41 is a process conceptual diagram of the manufacturing method of a semiconductor device according to the embodiment.

Then, a member in which a second semiconductor layer 35 is formed on a wafer 36 is prepared separately from the first member 240, and is pasted to the first member 240 as illustrated in the process conceptual diagram of FIG. 39. Then, the first semiconductor layer 34 and the second semiconductor layer 35 are boded to each other by being heated, and so on, to be electrically connect to each other. Then, the wafer 36 is thinned by chemical mechanical polishing or the like, and a redistribution layer 37 is formed on the thinned wafer 36 to obtain a first member 241 illustrated in the process conceptual diagram of FIG. 40. Then, a portion of the second layer 20 in the first member 241, the portion being closer to the heat dissipation layer 43, is heated as illustrated in the process conceptual diagram of FIG. 40, and a second member 340 is obtained, in which the carbonaceous material layer 21 is formed between the second layer 20 and the heat dissipation layer 43 as illustrated in the process conceptual diagram of FIG. 41 (S13).

Figure 42:
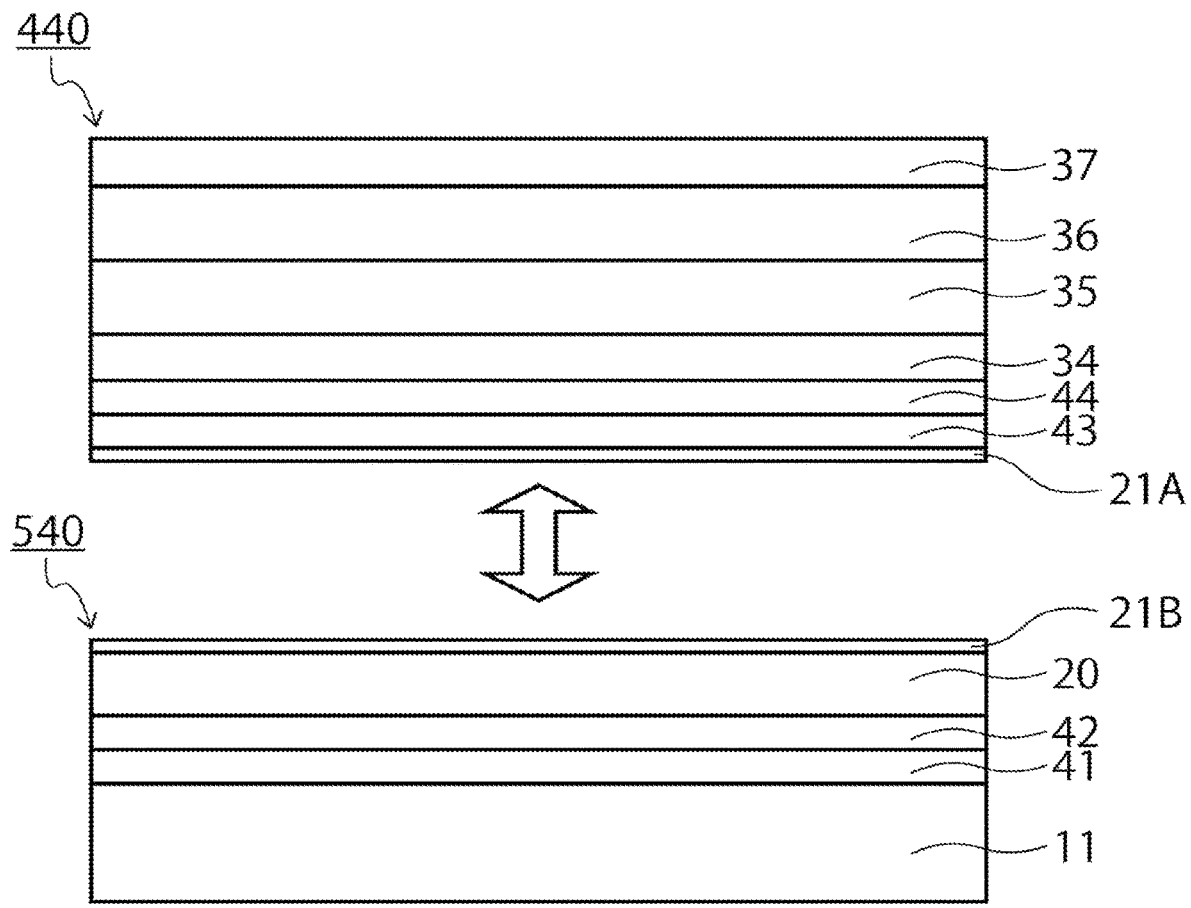
FIG. 42 is a process conceptual diagram of the manufacturing method of a semiconductor device according to the embodiment.

Next, as illustrated in the process conceptual diagram of FIG. 42, the second member 340 is cleaved from the carbonaceous material layer 21 to obtain a third member 440 (S20). The third member 440 includes the heat dissipation layer 43, the protective layer 44, the first semiconductor layer 34, the second semiconductor layer 35, the wafer 36, and the redistribution layer 37. Moreover, a member 540 is also obtained by the cleavage. The member 540 includes the support layer 11, the adhesion layer 41, the underlayer 42, and the second layer 20. The carbonaceous material layer 21 is separated into the carbonaceous material layer 21A of the third member 440 and the carbonaceous material layer 26B of the member 530.

Figure 43:
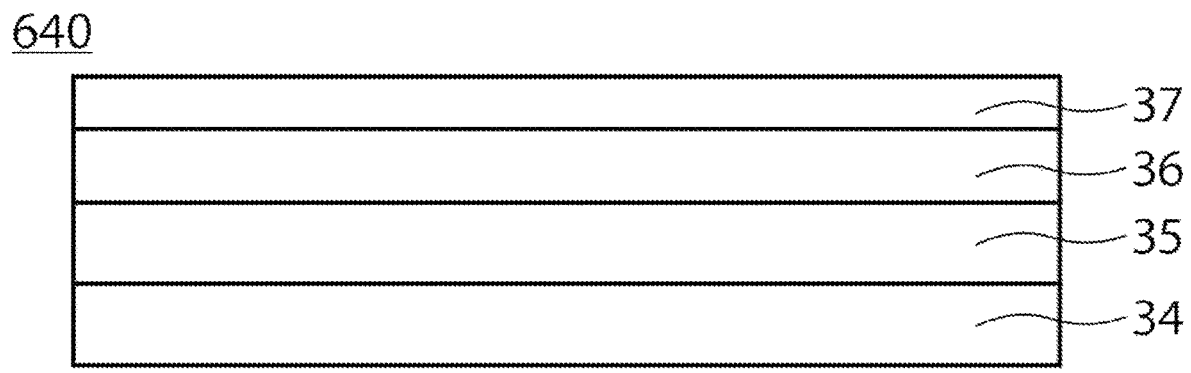
FIG. 43 is a process conceptual diagram of the manufacturing method of a semiconductor device according to the embodiment.

Then, the carbonaceous material layer 21A of the third member 440 is removed, and further, the heat dissipation layer 43 and protective layer 44 thereof, which are the intermediate layers, are removed according to needs, whereby a fourth member 640 illustrated in the process diagram of FIG. 43 can be obtained.

In the specification, some elements are represented only by chemical symbols.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, the manufacturing method comprising:
    heating a second layer of a first member including a first layer, the second layer, and a third layer, in which the first layer includes a support layer, the second layer includes a compound containing carbon and at least one element selected from the group consisting of silicon and a metal, the third layer includes a semiconductor layer and/or a wiring layer, and the second layer is located between the first layer and the third layer, and obtaining a second member in which a carbonaceous material layer is formed on a surface of the second layer and/or a carbonaceous material region is formed inside the second layer; and
    cleaving the second member from the carbonaceous material layer or the carbonaceous material region, and obtaining a third member including the third layer,
    wherein a metal layer is provided between the first and second layers of the first member and/or between the second and third layers of the first member,
    the metal layer is a layer of at least one metal selected from the group consisting of W, Ta, Cu, Ti, V, Cr, Mo, Zr, Hf, Co, Sc, Mn, Fe, Ni, Au, Ag, Pt and Pd or of an alloy containing the at least one metal, and
    wherein the carbonaceous material layer is formed between the metal layer and the second layer.

2. The manufacturing method according to claim 1, further comprising:
    forming the second layer on the first layer; and
    forming the third layer on the second layer.

3. The manufacturing method according to claim 1, wherein the metal of the compound is at least one selected from the group consisting of W, Ta, Cu, Ti, V, Cr, Nb, Mo, Zr, Hf, Co, Sc, Mn, Fe and Ni.

4. The manufacturing method according to claim 1, wherein the compound is at least one selected from the group consisting of SiC, SiCN, SiCO, SiCON, WC, TaC, CuC, TiC, VC, CrC, NbC, MoC, ZrC, HfC, CoC, ScC and MnC.

5. The manufacturing method according to claim 1, wherein the second layer contains particles of at least one metal selected from the group consisting of W, Ta, Cu, Ti, V, Cr, Nb, Mo, Zr, Hf, Co, Sc, Mn, Fe, Ni, Au, Ag, Pt, and Pd or particles of an alloy containing the at least one metal.

6. The manufacturing method according to claim 5, wherein an average primary diameter of the particles of the at least one metal or the alloy containing the at least one metal is 1 nm or more and 10 nm or less.

7. The manufacturing method according to claim 1, wherein 90 wt % or more of the second layer of the first member is the compound.

8. The manufacturing method according to claim 1, wherein a thickness of the second layer is 1 nm or more and 500 nm or less.

9. The manufacturing method according to claim 1, wherein a concentration of the compound containing carbon and the at least one element selected from the group consisting of silicon and metals, the compound being included in the second layer before being heated, is 98 wt % or more and 100 wt %.

10. The manufacturing method according to claim 1, wherein a thickness of the carbonaceous material layer is 0.1 nm or more and 100 nm or less.

11. The manufacturing method according to claim 1, wherein a heating temperature in the obtaining the second member is 1000° C. or higher and 1500° C. or lower.

12. The manufacturing method according to claim 1, wherein 50 wt % or more of the carbonaceous material layer is graphene and/or graphite.

13. A manufacturing method of a semiconductor device, the manufacturing method comprising:
    heating a second layer of a first member including a first layer, the second layer, and a third layer, in which the first layer includes a support layer, the second layer includes a compound containing carbon and at least one element selected from the group consisting of silicon and a metal, the third layer includes a semiconductor layer and/or a wiring layer, and the second layer is located between the first layer and the third layer, and obtaining a second member in which a carbonaceous material layer is formed on a surface of the second layer and/or a carbonaceous material region is formed inside the second layer; and
    cleaving the second member from the carbonaceous material layer or the carbonaceous material region, and obtaining a third member including the third layer,
    wherein the third member includes the second layer and/or the carbonaceous material layer, and
    wherein the manufacturing method further includes removing the second layer and/or the carbonaceous material layer in the third member to obtain a fourth member.

14. The manufacturing method according to claim 13, further comprising:
    forming the second layer on the first layer; and
    forming the third layer on the second layer.

15. The manufacturing method according to claim 13, wherein the metal of the compound is at least one selected from the group consisting of W, Ta, Cu, Ti, V, Cr, Nb, Mo, Zr, Hf, Co, Sc, Mn, Fe and Ni.

16. The manufacturing method according to claim 13, wherein the compound is at least one selected from the group consisting of SiC, SiCN, SiCO, SiCON, WC, TaC, CuC, TiC, VC, CrC, NbC, MoC, ZrC, HfC, CoC, ScC and MnC.

17. A manufacturing method of a semiconductor device, the manufacturing method comprising:
    heating a second layer of a first member including a first layer, the second layer, and a third layer, in which the first layer includes a support layer, the second layer includes a compound containing carbon and at least one element selected from the group consisting of silicon and a metal, the third layer includes a semiconductor layer and/or a wiring layer, and the second layer is located between the first layer and the third layer, and obtaining a second member in which a carbonaceous material layer is formed on a surface of the second layer and/or a carbonaceous material region is formed inside the second layer; and
    cleaving the second member from the carbonaceous material layer or the carbonaceous material region, and obtaining a third member including the third layer,
    wherein the first member is obtained by forming the third layer on a surface of the second layer of the support in which the second layer is provided on the first layer, and
    wherein a heat treatment temperature for forming the third layer is 300° C. or higher and 950° C. or lower.

18. The manufacturing method according to claim 17, further comprising:
    forming the second layer on the first layer; and
    forming the third layer on the second layer.

19. The manufacturing method according to claim 17, wherein the metal of the compound is at least one selected from the group consisting of W, Ta, Cu, Ti, V, Cr, Nb, Mo, Zr, Hf, Co, Sc, Mn, Fe and Ni.

20. The manufacturing method according to claim 17, wherein the compound is at least one selected from the group consisting of SiC, SiCN, SiCO, SiCON, WC, TaC, CuC, TiC, VC, CrC, NbC, MoC, ZrC, HfC, CoC, ScC and MnC.

* * * * *